United States Patent
Tsuchihashi et al.

(10) Patent No.: US 8,889,339 B2
(45) Date of Patent: Nov. 18, 2014

(54) RESIST PATTERN FORMING METHOD, RESIST PATTERN, CROSSLINKABLE NEGATIVE CHEMICAL AMPLIFICATION RESIST COMPOSITION FOR ORGANIC SOLVENT DEVELOPMENT, RESIST FILM AND RESIST-COATED MASK BLANKS

(71) Applicants: Toru Tsuchihashi, Shizuoka (JP); Tadateru Yatsuo, Shizuoka (JP); Koutarou Takahashi, Shizuoka (JP); Tomotaka Tsuchimura, Shizuoka (JP)

(72) Inventors: Toru Tsuchihashi, Shizuoka (JP); Tadateru Yatsuo, Shizuoka (JP); Koutarou Takahashi, Shizuoka (JP); Tomotaka Tsuchimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/035,484

(22) Filed: Sep. 24, 2013

(65) Prior Publication Data
US 2014/0030640 A1  Jan. 30, 2014

Related U.S. Application Data

(63) Continuation of application No. PCT/JP2012/054478, filed on Feb. 17, 2012.

(30) Foreign Application Priority Data

Mar. 25, 2011 (JP) ................................. 2011-068467

(51) Int. Cl.
| | |
|---|---|
| G03F 1/50 | (2012.01) |
| G03F 7/20 | (2006.01) |
| G03F 7/32 | (2006.01) |
| C08F 8/14 | (2006.01) |
| C08F 12/24 | (2006.01) |
| C08F 212/14 | (2006.01) |
| C08J 3/24 | (2006.01) |
| G03F 7/038 | (2006.01) |
| G03F 7/004 | (2006.01) |

(52) U.S. Cl.
CPC ... G03F 7/20 (2013.01); C08F 8/14 (2013.01); C08F 12/24 (2013.01); C08F 212/14 (2013.01); C08J 3/24 (2013.01); G03F 7/0382 (2013.01); G03F 7/325 (2013.01); G03F 1/50 (2013.01); G03F 7/004 (2013.01); C08J 2325/18 (2013.01); Y10S 430/143 (2013.01)
USPC ........... 430/296; 430/5; 430/270.1; 430/325; 430/331; 430/942

(58) Field of Classification Search
CPC ............. G03F 1/50; G03F 7/20; G03F 7/004; G03F 7/0382
USPC ................... 430/5, 270.1, 296, 325, 331, 942
See application file for complete search history.

(56) References Cited

U.S. PATENT DOCUMENTS

| | | | |
|---|---|---|---|
| 5,665,527 | A | 9/1997 | Allen et al. |
| 2002/0061462 | A1 | 5/2002 | Uenishi |
| 2008/0241745 | A1 | 10/2008 | Shirakawa et al. |

FOREIGN PATENT DOCUMENTS

| | | |
|---|---|---|
| JP | 62-175739 A | 8/1987 |
| JP | 7-199467 A | 8/1995 |
| JP | 3277114 B2 | 4/2002 |
| JP | 2002-148806 A | 5/2002 |
| JP | 2006-227174 A | 8/2006 |
| JP | 2008-268935 A | 11/2008 |
| JP | 2010-17489 A | 1/2010 |
| JP | 2011-65105 A | 3/2011 |
| JP | 2011-191740 A | 9/2011 |
| WO | 2010/087516 A1 | 8/2010 |

OTHER PUBLICATIONS

International Search Report dated Apr. 10, 2012, issued in International Application No. PCT/JP2012/054478 (PCT/ISA/210).
Written Opinion dated Apr. 10, 2012 issued in International Application No. PCT/JP2012/054478 (PCT/ISA/237).

*Primary Examiner* — Christopher Young
(74) *Attorney, Agent, or Firm* — Sughrue Mion, PLLC

(57) ABSTRACT

A resist pattern forming method contains: in the following order, (1) forming a resist film by using a negative chemical amplification resist composition containing (A) a polymer compound having a repeating unit represented by formula (1) as defined in the specification, (B) a compound capable of generating an acid upon irradiation with an actinic ray or radiation and (C) a crosslinking agent capable of crosslinking the polymer compound (A) by an action of an acid; (2) exposing the resist film, so as to form an exposed resist film; and (4) developing the exposed resist film by using a developer containing an organic solvent.

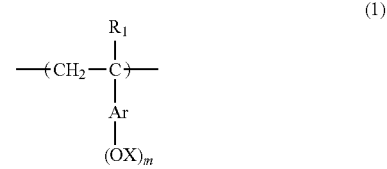

12 Claims, No Drawings

RESIST PATTERN FORMING METHOD, RESIST PATTERN, CROSSLINKABLE NEGATIVE CHEMICAL AMPLIFICATION RESIST COMPOSITION FOR ORGANIC SOLVENT DEVELOPMENT, RESIST FILM AND RESIST-COATED MASK BLANKS

CROSS REFERENCE TO RELATED APPLICATION

This is a continuation of International Application No. PCT/JP2012/054478 filed on Feb. 17, 2012, and claims priority from Japanese Application No. 2011-068467 filed on Mar. 25, 2011, the entire disclosures of which are incorporated herein by reference.

TECHNICAL FIELD

The present invention relates to a resist pattern forming method using a negative chemical amplification resist composition, which is suitably used in the ultramicrolithography process such as production of VLSI or high-capacity microchip and in other photofabrication processes. More specifically, the present invention relates to a resist pattern forming method suitably usable for microfabrication of a semiconductor device, where electron beam, X-ray or EUV light (wavelength: near 13 nm) is used, a resist pattern, a crosslinkable negative chemical amplification resist composition for organic solvent development, a resist film and a resist-coated mask blanks.

BACKGROUND ART

In the process of producing a semiconductor device such as IC and LSI, microfabrication by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is proceeding.

The lithography using electron beam, X-ray or EUV light is positioned as a next-generation or next-next-generation pattern formation technique, and a high-sensitivity high-resolution resist is being demanded.

In particular, realization of high sensitivity for shortening the processing time is a very important task, but when realization of high sensitivity is sought for, not only reduction in the resolution but also worsening of the line edge roughness (LER) are caused, and development of a resist satisfying these properties at the same time is strongly demanded.

Here, the line edge roughness means that the edge at the interface between the resist pattern and the substrate irregularly fluctuates in the direction perpendicular to the line direction due to characteristics of the resist and when the pattern is viewed from right above, the edge gives an uneven appearance. This unevenness is transferred in the etching step using the resist as a mask, leading to decrease in the yield.

The high sensitivity is in a trade-off relationship with high resolution, good pattern profile and improved line edge roughness, and it is very important how satisfy all of these properties at the same time.

The resist composition includes a "positive" type using a resin sparingly soluble or insoluble in an alkali developer and forming a pattern by solubilizing the exposed area in an alkali developer by the exposure to radiation, and a "negative" type using a resin soluble in an alkali developer and forming a pattern by sparingly solubilizing or insolubilizing the exposed area in an alkali developer by the exposure to radiation.

As the resist suitable for such a lithography process using electron beam, X-ray or EUV light, in view of realization of high sensitivity, a chemical amplification positive resist composition utilizing an acid catalytic reaction is mainly studied, and a chemical amplification positive resist composition composed of, as the main component, a phenolic resin being insoluble or sparingly soluble in an alkali developer and having a property of becoming soluble in an alkali developer by the action of an acid (hereinafter, simply referred to as a "phenolic acid-decomposable resin"), and an acid generator is being effectively used.

On the other hand, the manufacture of a semiconductor device or the like requires formation of various patterns such as line, trench and hole. In order to meet the requirement for formation of various patterns, development of not only a positive resist composition but also a negative resist composition is being made (see, for example, JP-A-2002-148806 (the term "JP-A" as used herein means an "unexamined published Japanese patent application") and JP-A-2008-268935).

JP-A-62-175739 discloses a resist film composed of a polymethyl methacrylate or methyl methacrylate copolymer, wherein in performing patterning by using an electron beam, development with $CH_3COOC_nH_{2n+1}$ ($n \leq 4$) is performed in place of development with isoamyl acetate.

JP-A-2006-227174 discloses patterning utilizing a technique of cutting the polymer chain by irradiation with an electron beam and thereby reducing the molecular weight, wherein a specific organic solvent such as benzene-based solvent is used as the developer.

Japanese Patent No. 3277114 discloses a film containing a halogenated polymer or a polymer having an alkylsiloxy group as the substituent, wherein the film is exposed and then developed with a critical fluid in view of environmental problem.

JP-A-7-199467 discloses, in Examples, a positive resist film which is developed with a mixed solvent of ethyl acetate and isoamyl acetate, in place of an alkali developer.

JP-A-2010-017489 discloses a resist pattern forming method comprising, in order, a step of forming a film by using a negative chemical amplification resist composition that effects negative conversion by a crosslinking reaction, a step of exposing the film, and a step of developing the exposed film by using a developer containing an organic solvent.

However, the techniques so far are not successful in satisfying high sensitivity, high resolution, good pattern profile, reduction in the line edge roughness, and high dry etching resistance all at the same time in the ultrafine region.

SUMMARY OF INVENTION

An object of the present invention is to provide a resist pattern forming method capable of forming a pattern satisfying high sensitivity, high resolution property (for example, high resolution, excellent pattern profile and small line edge roughness (LER)) and good dry etching resistance all the same time, a resist pattern, a crosslinkable negative chemical amplification resist composition for organic solvent development, a resist film and a resist-coated mask blanks.

As a result of intensive studies, the present inventors have found that the above-described object can be attained by a resist pattern forming method using a negative chemical amplification resist composition containing a polymer compound having a specific structure, and a developer containing an organic solvent.

That is, the present invention is as follows.

[1] A resist pattern forming method, comprising: in the following order, (1) forming a resist film by using a negative chemical amplification resist composition containing (A) a polymer compound having a repeating unit represented by formula (1), (B) a compound capable of generating an acid upon irradiation with an actinic ray or radiation and (C) a crosslinking agent capable of crosslinking the polymer compound (A) by an action of an acid;

(2) exposing the resist film, so as to form an exposed resist film; and (4) developing the exposed resist film by using a developer containing an organic solvent:

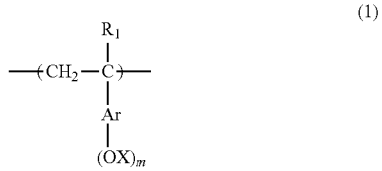

(1)

wherein $R_1$ represents a hydrogen atom or a methyl group;

X represents a group having a non-acid-decomposable polycyclic alicyclic hydrocarbon structure;

Ar represents an aromatic ring; and m is an integer of 1 or more.

[2] The resist pattern forming method as described in [1] above, wherein a concentration of the organic solvent in the developer is 50 mass % or more.

[3] The resist pattern forming method as described in [1] or [2] above, wherein the organic solvent contained in the developer is one or more kinds of solvents selected from the group consisting of an ester-based solvent, a ketone-based solvent, an alcohol-based solvent, an amide-based solvent, an ether-based solvent and a hydrocarbon-based solvent.

[4] The resist pattern forming method as described in any one of [1] to [3] above, wherein the developer contains, as the organic solvent, a solvent (S-1) working out to a good solvent for the resist film before exposure and a solvent (S-2) working out to a poor solvent for the resist film before exposure, and assuming that a boiling point of the solvent (S-1) is (bp-1) and a boiling point of the solvent (S-2) is (bp-2), the solvents satisfy a relationship of formula (I):

(bp-2)>(bp-1)    formula (I).

[5] The resist pattern forming method as described in any one of [1] to [4] above, wherein the repeating unit represented by formula (1) is a repeating unit represented by the following formula (2) and the polymer compound (A) further contains a repeating unit represented by the following formula (3):

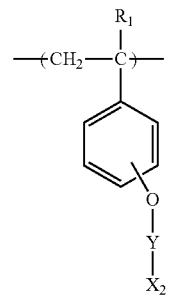

(2)

wherein $R_1$ represents a hydrogen atom or a methyl group;

Y represents a single bond or a divalent linking group; and $X_2$ represents a non-acid-decomposable polycyclic alicyclic hydrocarbon group:

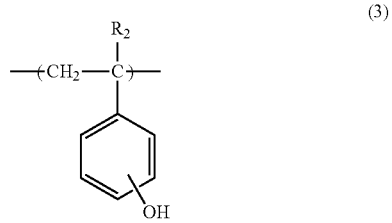

(3)

wherein $R_2$ represents a hydrogen atom or a methyl group.

[6] The resist pattern forming method as described in [4] or [5] above, wherein the solvent (S-1) is an ester-based solvent, a ketone-based solvent or an ether-based solvent.

[7] The resist pattern forming method as described in any one of [4] to [6] above, wherein the solvent (S-2) is a hydrocarbon-based solvent.

[8] The resist pattern forming method as described in any one of [1] to [7] above, wherein the exposure in (2) exposing the resist film is performed using an electron beam or EUV light.

[9] A resist pattern, which is formed by the resist pattern forming method described in any one of [1] to [8] above.

[10] A crosslinkable negative chemical amplification resist composition for organic solvent development, which is used for the resist pattern forming method described in any one of [1] to [8] above.

[11] A resist film, which is formed from the crosslinkable negative chemical amplification resist composition described in [10] above.

[12] A resist-coated mask blanks, which is coated with the resist film described in [11] above.

DESCRIPTION OF EMBODIMENTS

The resist pattern forming method, the resist pattern, the crosslinkable negative chemical amplification resist composition for organic solvent development, the resist film and the resist-coated mask blanks of the present invention are described in detail below.

Incidentally, in the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

[Resist Pattern Forming Method and Resist Pattern]

The mode of using the negative chemical amplification resist composition of the present invention is described below.

The resist pattern forming method of the present invention comprises, in order, (1) a step of forming a resist film by using the later-described negative chemical amplification resist composition that effects negative conversion by a crosslinking reaction, (2) a step of exposing the film, and (4) a step of developing the exposed film by using a developer containing an organic solvent (hereafter also referred to as an organic solvent-containing developer).

The "negative conversion" as used herein means that the resin is increased in the molecular weight by a crosslinking reaction and becomes insoluble in a solvent (developer).

Also, the resist pattern of the present invention is formed by the resist pattern forming method of the present invention.

Furthermore, as described later, the present invention also relates to a crosslinkable negative chemical amplification resist composition for organic solvent development, which is used for the resist pattern forming method of the present invention.

(1) Film Formation

The present invention also relates to a resist film formed of the crosslinkable negative chemical amplification resist composition of the present invention. For obtaining a film of the negative chemical amplification resist composition, the composition is used by dissolving the later-described components in a solvent, filtering the solution through a filter, if desired, and applying it on a support (substrate). The filter is preferably a polytetrafluoroethylene-, polyethylene- or nylon-made filter having a pore size of 0.1 μm or less, more preferably 0.05 μm or less, still more preferably 0.03 μm or less. The coating film is prebaked at 60 to 150° C. for 1 to 20 minutes, preferably at 80 to 140° C. for 1 to 10 minutes, to form a thin film.

The composition is applied on such a substrate as used in the production of an integrated circuit device (for example, a silicon or silicon dioxide-coated substrate) by an appropriate coating method such as spinner and then dried to form a photosensitive film.

If desired, a commercially available inorganic or organic antireflection film may be also used. Furthermore, the antireflection film may be used by applying it as an underlayer of the resist.

The present invention also relates to a resist-coated mask blanks coated with the thus-obtained resist film. As the transparent substrate used when forming a resist pattern on a photomask blanks for the production of a photomask so as to obtain such a resist-coated mask blanks, a transparent substrate such as quartz and calcium fluoride is used. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium tantalum, tungsten, titanium and niobium is stacked. As the material used for the outermost layer, examples include a material with the main constituent material being a material containing silicon or containing silicon and oxygen and/or nitrogen, a silicon compound material with the main constituent material being the material above which further contains a transition metal, and a transition metal compound material with the main constituent material being a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where a plurality of materials are applied one on another. In the case of a multilayer structure, the film thickness per layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

Out of the materials above, when pattern formation is performed using a chemical amplification resist composition on a photomask blanks having in the outermost surface layer thereof a material containing chromium and oxygen or nitrogen, a so-called undercut profile having a waisted shape near the substrate is liable to be formed in general. However, when the present invention is used, the undercut problem can be improved as compared with the conventional mask blanks.

Subsequently, this resist film is irradiated with an actinic ray or radiation (e.g., electron beam), then preferably baked (usually at 80 to 150° C., preferably from 90 to 130° C.), and subsequently developed, whereby a good pattern can be obtained. Etching, ion implantation or the like is appropriately performed by using this pattern as the mask to produce, for example, a semiconductor fine circuit or an imprint mold structure.

Incidentally, the process when preparing an imprint mold by using the composition of the present invention is described, for example, in Japanese Patent 4,109,085, JP-A-2008-162101 and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basic and Technology Expansion•Application Development of Nanoimprint—Fundamental Technology of Nanoimprint and Latest Technology Expansion), Frontier Shuppan.

(2) Exposure

The formed film is irradiated with an actinic ray or radiation through a prescribed mask. Incidentally, in the case of irradiation with an electron beam, lithography not through a mask (i.e. direct drawing) is generally performed.

The actinic ray or radiation is not particularly limited but is, for example, KrF excimer laser, ArF excimer laser, EUV light or an electron beam, and EUV light or an electron beam is preferred. That is, the exposure in the step (2) of exposing the film is preferably performed by using an electron beam or EUV light.

(3) Baking

After the exposure, baking (heating) is preferably performed before performing the development.

The baking is preferably performed at a heating temperature of 80 to 150° C., more preferably from 90 to 150° C., still more preferably from 100 to 140° C. The heating time is preferably from 1 to 20 minutes, more preferably from 1 to 10 minutes.

The heating can be performed by a device attached to a normal exposure/developing machine and may be also performed by using a hot plate or the like.

The reaction in the exposed area is accelerated by the baking, and the sensitivity and pattern profile are improved.

(4) Development

In the present invention, development is performed using an organic solvent-containing developer.

Developer:

The organic solvent used for the developer is preferably an organic solvent having a vapor pressure at 20° C. of 5 kPa or less, more preferably 3 kPa or less, still more preferably 2 kPa or less. By setting the vapor pressure of the organic solvent to 5 kPa or less, evaporation of the developer on a substrate or in a development cup is suppressed and the temperature uniformity in the wafer plane is enhanced, as a result, the dimensional uniformity in the wafer plane is improved.

As the organic solvent used for the developer, various organic solvents are widely used, but, for example, one or more kinds of solvents selected from the group consisting of an ester-based solvent, a ketone-based solvent, an alcohol-based solvent, an amide-based solvent, an ether-based solvent and a hydrocarbon-based solvent may be used.

In particular, the developer used for the resist pattern forming method of the present invention is preferably a developer containing one or more kinds of solvents selected from the group consisting of a ketone-based solvent, an ester-based solvent, an alcohol-based solvent and an ether-based solvent.

Examples of the ester-based solvent include an alkyl carboxylate-based solvent such as methyl acetate, butyl acetate, ethyl acetate, isopropyl acetate, amyl acetate, isoamyl acetate, ethyl-3-ethoxypropionate, propylene glycol diacetate, 3-methoxybutyl acetate, 3-methyl-3-methoxybutyl acetate, methyl formate, ethyl formate, butyl formate, propyl formate, ethyl lactate, butyl lactate and propyl lactate; and an alkylene glycol monoalkyl ether carboxylate-based solvent such as propylene glycol monomethyl ether acetate (PGMEA; another name: 1-methoxy-2-acetoxypropane), ethylene glycol monoethyl ether acetate, diethylene glycol monobutyl ether acetate, diethylene glycol monoethyl ether acetate and propylene glycol monoethyl ether acetate. Among these, butyl acetate, amyl acetate, isoamyl acetate, ethyl lactate and propylene glycol monomethyl ether acetate are preferred.

Examples of the ketone-based solvent include 1-octanone, 2-octanone, 1-nonanone, 2-nonanone, acetone, 4-heptanone, 1-hexanone, 2-hexanone, diisobutyl ketone, cyclopentanone, cyclohexanone, cycloheptanone, methylcyclohexanone, phenylacetone, methyl ethyl ketone, methyl amyl ketone, methyl isobutyl ketone, acetyl acetone, acetonyl acetone, ionone, diacetonyl alcohol, acetyl carbinol, acetophenone, methyl naphthyl ketone, isophorone and propylene carbonate. Among these, an alkyl ketone-based solvent such as methyl isobutyl ketone, methyl amyl ketone, cyclopentanone, cyclohexanone and cycloheptanone is preferred.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, hexyl alcohol (e.g., n-hexyl alcohol), heptyl alcohol (e.g., n-heptyl alcohol), octyl alcohol (e.g., n-octyl alcohol) and decanol (e.g., n-decanol); a glycol-based solvent such as ethylene glycol, diethylene glycol and triethylene glycol, 1,2-propylene glycol, 1,3-propylene glycol, 1,2-butylene glycol, 1,3-butylene glycol and 1,4-butylene glycol; an alkylene glycol monoalkyl ether-based solvent such as ethylene glycol monomethyl ether, propylene glycol monomethyl ether (PGME; another name: 1-methoxy-2-propanol), ethylene glycol monoethyl ether, propylene glycol monoethyl ether, diethylene glycol monomethyl ether and triethylene glycol monoethyl ether; a glycol ether-based solvent such as methoxymethyl butanol and propylene glycol dimethyl ether; and a phenol-based solvent such as phenol and cresol. Among these, 1-hexanol, 2-hexanol, 1-octanol, 2-ethyl-hexanol, propylene glycol monomethyl ether and cresol are preferred.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the ether-based solvent include dioxane, tetrahydrofuran and tetrahydropyran, in addition to the above-described alkylene glycol monoalkyl ether-based solvent and glycol ether-based solvent.

Examples of the hydrocarbon-based solvent include an aromatic hydrocarbon-based solvent such as toluene and xylene, and an aliphatic hydrocarbon-based solvent such as pentane, hexane, octane, decane, undecane and dodecane.

The developer preferably contains one or more kinds of solvents selected from an alkylene glycol monoalkyl ether carboxylate-based solvent, an alkylene glycol monoalkyl ether-based solvent, an alkyl carboxylate-based solvent and an alkyl ketone-based solvent, more preferably one or more kinds of solvents selected from propylene glycol monomethyl ether, propylene glycol monomethyl ether acetate, methyl isobutyl ketone, methyl amyl ketone, cyclopentanone, cyclohexanone, ethyl lactate and butyl acetate.

A plurality of these solvents may be mixed, or the solvent may be used by mixing it with a solvent other than those described above or with water.

The concentration of the organic solvent (in the case of mixing a plurality of solvents, the total concentration) in the developer is preferably 50 mass % or more, more preferably 70 mass % or more, still more preferably 90 mass % or more, and in particular, the developer is preferably composed of substantially only an organic solvent. Incidentally, the expression "composed of substantially only an organic solvent" includes containing a small amount of a surfactant, an antioxidant, a stabilizer, a defoaming agent or the like. Specifically, the concentration of the organic solvent in the developer is preferably from 99.0 to 100 mass %, more preferably from 99.5 to 100 mass %. (In this specification, mass ratio is equal to weight ratio.)

The percentage of water content in the developer is preferably 10 mass % or less, more preferably 5 mass % or less, still more preferably 3 mass % or less, and it is most preferred to contain substantially no water (specifically, the percentage of water content in the developer is preferably 1 mass % or less, more preferably 0.5 mass % or less, and ideally 0 mass %, that is, water is not contained). By setting the percentage of water content to 10 mass % or less, good development characteristics can be obtained.

In the case of using a mixture of two or more kinds of organic solvents in the developer, the developer preferably contains, as the organic solvent, a solvent (S-1) working out to a good solvent for the resist film before exposure and a solvent (S-2) working out to a poor solvent for the resist film before exposure, and assuming that the boiling point of the solvent (S-1) is (bp-1) and the boiling point of the solvent (S-2) is (bp-2), it is preferred to select organic solvents satisfying the relationship of the following formula (I):

$$(bp\text{-}2) > (bp\text{-}1) \qquad \text{formula (I)}$$

Here, the good solvent is a solvent having solubility of 10 nm/sec or more in terms of dissolution rate when dissolving the resist film before exposure by the solvent alone and is preferably a solvent having solubility of 20 nm/sec or more.

The poor solvent is a solvent having solubility of 0.5 nm/sec or less in terms of dissolution rate when dissolving the resist film before exposure by the solvent alone and is preferably a solvent having solubility of 0.2 nm/sec or less, more preferably a solvent having solubility of 0.1 nm/sec or less.

The measurement temperature of the dissolution rate is 23° C., and the measuring method includes, for example, the method described in Examples later.

As indicated by formula (I), organic solvents combined such that the boiling point (bp-2) of the poor solvent is higher than the boiling point (bp-1) of the good solvent are preferably mixed and used as the developer.

By using such a developer, the good solvent having higher volatility than the poor solvent is volatilized first at the time of drying the wafer after development. The good solvent scarcely remains in the resist pattern, whereby swelling, pattern collapse and the like of the resist pattern are improved.

In view of resolution, the boiling point (bp-2) of the poor solvent is preferably higher than the boiling point (bp-1) of the good solvent by 10° C. or more, more preferably by 25° C. or more, still more preferably by 40° C. or more. Also, the boiling point (bp-2) of the poor solvent is preferably the boiling point (bp-1) of the good solvent+100° C. or less, more preferably the boiling point (bp-1) of the good solvent+80° C. or less.

The solvent (S-1) is preferably an ester-based solvent, a ketone-based solvent or an ether-based solvent, more preferably an ester-based solvent or a ketone-based solvent.

The solvent (S-2) is preferably a hydrocarbon-based solvent.

Specific examples and preferred examples of these solvents are the same as those described above.

Surfactant:

In the organic solvent-containing developer, a surfactant may be added in an appropriate amount, if desired.

As the surfactant, the same surfactants as those used in the later-described resist composition can be used.

The amount of the surfactant used is usually from 0.001 to 5 mass %, preferably from 0.005 to 2 mass %, more preferably 0.01 to 0.5 mass %, based on the entire amount of the developer.

Developing Method:

As regards the developing method, for example, a method of dipping the substrate in a bath filled with the developer for a fixed time (dip method), a method of raising the developer on the substrate surface by the effect of a surface tension and keeping it still for a fixed time, thereby performing development (puddle method), a method of spraying the developer on the substrate surface (spray method), and a method of continuously ejecting the developer on the substrate spinning at a constant speed while scanning the developer ejecting nozzle at a constant rate (dynamic dispense method) may be applied.

After the step of performing development, a step of stopping the development by replacing the solvent with another solvent may be practiced.

The development time is preferably a time period long enough to sufficiently dissolve the resin, crosslinking agent and the like in the unexposed area, and usually, the development time is preferably from 10 to 300 seconds, more preferably from 20 to 120 seconds.

The temperature of the developer is preferably from 0 to 50° C., more preferably from 15 to 35° C.

The amount of the developer can be appropriately adjusted according to the developing method.

(5) Rinsing

The resist pattern forming method of the present invention may include (5) a step of rinsing the film with a rinsing solution containing an organic solvent, after the development step (4).

Rinsing Solution:

The organic solvent used for the rinsing solution is preferably an organic solvent having a vapor pressure at 20° C. of 0.05 to 5 kPa, more preferably from 0.1 to 5 kPa, and most preferably from 0.12 to 3 kPa. By setting the vapor pressure of the organic solvent used for the rinsing solution to from 0.05 to 5 kPa, the temperature uniformity in the wafer plane is enhanced and moreover, swelling attributable to permeation of the rinsing solution is suppressed, as a result, the dimensional uniformity in the wafer plane is improved.

As the rinsing solution, various organic solvents may be used, but, for example, a rinsing solution containing one or more kinds of organic solvents selected from the group consisting of a hydrocarbon-based solvent, a ketone-based solvent, an ester-based solvent, an alcohol-based solvent, an amide-based solvent and an ether-based solvent, or water is preferably used.

More preferably, after the development, a step of rinsing the film is performed by using a rinsing solution containing one or more kinds of organic solvents selected from the group consisting of a ketone-based solvent, an ester-based solvent, an alcohol-based solvent, an amide-based solvent and a hydrocarbon-based solvent. Still more preferably, after the development, a step of rinsing the film is performed by using a rinsing solution containing one or more kinds of organic solvents selected from the group consisting of an alcohol-based solvent and a hydrocarbon-based solvent.

Specific examples of the ketone-based solvent, ester-based solvent, alcohol-based solvent, amide-based solvent, ether-based solvent and hydrocarbon-based solvent, which are used as the rinsing solution, are the same as those described above for the developer.

Above all, a rinsing solution containing one or more kinds of solvents selected from the group consisting of a monohydric alcohol-based solvent and a hydrocarbon-based solvent is preferably used.

The monohydric alcohol-based solvent used in the rinsing step after development includes a linear, branched or cyclic monohydric alcohol, and specific examples of the monohydric alcohol which can be used include 1-butanol, 2-butanol, 3-methyl-1-butanol, tert-butyl alcohol, isopropyl alcohol, cyclopentanol, 1-hexanol, and cyclohexanol. Among these, 1-butanol, 2-butanol, 3-methyl-1-butanol, isopropyl alcohol and 1-hexanol are preferred.

The hydrocarbon-based solvent includes an aromatic hydrocarbon-based solvent such as toluene and xylene, and an aliphatic hydrocarbon-based solvent such as octane, decane, undecane and dodecane.

A plurality of these components may be mixed, or the solvent may be used by mixing it with an organic solvent other than those described above.

The organic solvent may be mixed with water, but the percentage of water content in the rinsing solution is usually 30 mass % or less, preferably 10 mass % or less, more preferably 5 mass % or less, still more preferably 3 mass % or less, and the rinsing solution most preferably contains no water. By setting the percentage of water content to 30 mass % or less, good development characteristics can be obtained.

The rinsing solution may be also used after adding thereto an appropriate amount of a surfactant.

As the surfactant, the same surfactants as those used in the later-described resist composition can be used, and the amount of the surfactant used is usually from 0.001 to 5 mass %, preferably from 0.005 to 2 mass %, more preferably from 0.01 to 0.5 mass %, based on the entire amount of the rinsing solution.

Rinsing Method

In the rinsing step, the wafer after development is rinsed using the above-described rinsing solution containing an organic solvent (hereafter also referred to as an organic solvent-containing rinsing solution).

The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dip method), and a method of spraying the rinsing solution on the substrate surface (spray method). Above all, it is preferred to perform the rinsing treatment by the spin coating method and after the rinsing, remove the rinsing solution from the substrate surface by spinning the substrate at a rotation speed of 2,000 to 4,000 rpm. The time for which the substrate is rotated may be set according to the rotation speed insofar as removal of the rinsing solution from the substrate surface is achieved, but the rotation time is usually from 10 seconds to 3 minutes. Incidentally, the rinsing is preferably performed at the room temperature condition.

The rinsing time is preferably set to allow for no remaining of the development solvent on the wafer and usually, the rinsing time is preferably from 10 to 300 seconds, more preferably from 20 to 120 seconds.

The temperature of the rinsing solution is preferably from 0 to 50° C., more preferably 15 to 35° C.

The amount of the rinsing solution can be appropriately adjusted according to the rinsing method.

After the development or rinsing treatment, a treatment of removing the developer or rinsing solution attached to the pattern by a supercritical fluid may be performed.

Furthermore, after the development or rinsing treatment or the treatment with a supercritical fluid, a heating step may be performed so as to remove the solvent remaining in the pattern. The heating temperature and time are not particularly limited as long as a good resist pattern is obtained, and the heating temperature and time are usually from 40 to 160° C. and from 10 seconds to 3 minutes. The heating treatment may be performed a plurality of times.

[Negative Chemical Amplification Resist Composition]

The negative chemical amplification resist composition capable of effecting negative conversion by a crosslinking reaction, which is used for the resist pattern forming method of the present invention, is described below.

The negative chemical amplification resist composition that effects negative conversion by a crosslinking reaction contains (A) a polymer compound having a later-described repeating unit represented by formula (1), (B) a compound capable of generating an acid upon irradiation with an actinic ray or radiation, and (C) a crosslinking agent for crosslinking the polymer compound (A) by the action of the acid.

[1] (A) Polymer Compound

The negative chemical amplification resist composition for use in the present invention contains (A) a polymer compound having a repeating unit represented by the following formula (1). The repeating unit represented by the following formula (1) has a structure where a hydrogen atom of a phenolic hydroxyl group is replaced by a group having a non-acid-decomposable polycyclic alicyclic hydrocarbon structure.

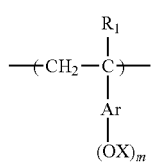

(wherein $R_1$ represents a hydrogen atom or a methyl group, X represents a group having a non-acid-decomposable polycyclic alicyclic hydrocarbon structure, Ar represents an aromatic ring, and m is an integer of 1 or more).

In the present invention, (A) a polymer compound having a repeating unit represented by formula (1) is used, and the glass transition temperature (Tg) of the polymer compound (A) is high, so that a very hard resist film can be formed and the acid diffusion or dry etching resistance can be controlled. Accordingly, an acid is highly constrained from diffusion in the area exposed to an actinic ray or radiation such as electron beam and extreme-ultraviolet ray (EUV light), and this produces an excellent effect in terms of resolution, pattern profile and LER in a fine pattern. Also, the polymer compound (A) has a non-acid-decomposable polycyclic alicyclic hydrocarbon structure, and this contributes to high dry etching resistance. Furthermore, although details are unknown, it is presumed that the polycyclic alicyclic hydrocarbon structure has a high hydrogen radical-donating property and works out to a hydrogen source when decomposing the later-described photoacid generator, that is, (B) a compound capable of generating an acid upon irradiation with an actinic ray or radiation, as a result, the decomposition efficiency of the photoacid generator and in turn, the acid generation efficiency are enhanced. This is considered to contribute to excellent sensitivity.

In the specific structure of the repeating unit represented by formula (1) contained in the polymer compound (A) for use in the present invention, an aromatic ring such as benzene ring and a group having a non-acid-decomposable polycyclic alicyclic hydrocarbon structure are connected through an oxygen atom derived from a phenolic hydroxyl group. This structure not only contributes to high dry etching resistance as described above but also enables raising the glass transition temperature (Tg) of the polymer compound (A), and thanks to the combination of these effects, high resolution is provided.

In the present invention, the "non-acid-decomposable" means a property of not causing a decomposition reaction by the effect of an acid generated from the later-described compound (B) capable of generating an acid upon irradiation with an actinic ray or radiation.

The phenolic hydroxyl group as used in the present application is a group formed by substituting for a hydrogen atom of an aromatic ring group by a hydroxyl group. The aromatic ring is a monocyclic or polycyclic aromatic ring and includes, for example, a benzene ring and a naphthalene ring.

In formula (1), $R_1$ represents a hydrogen atom or a methyl group and is preferably a hydrogen atom.

Examples of the aromatic ring represented of Ar in formula (1) include an aromatic hydrocarbon ring having a carbon number of 6 to 18, which may have substituent, such as benzene ring, naphthalene ring, anthracene ring, fluorene ring and phenanthrene ring, and an aromatic heterocyclic ring containing a heterocyclic ring, such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred.

The aromatic ring of Ar may have a substituent other than the group represented by —OX, and examples of the substituent include an alkyl group (preferably having a carbon number of 1 to 4), a halogen atom (preferably a fluorine atom and a chlorine atom), a hydroxyl group, an alkoxy group (preferably having a carbon number of 1 to 4), a carboxyl group and an alkoxycarbonyl group (preferably having a carbon number of 2 to 5). Among these, an alkyl group, an alkoxy group and an alkoxycarbonyl group are preferred, and an alkoxy group is more preferred.

X represents a group having a non-acid-decomposable polycyclic alicyclic hydrocarbon structure. The group having a non-acid-decomposable polycyclic alicyclic hydrocarbon structure, represented by X, is not particularly limited as long as it is a monovalent group having a polycyclic alicyclic hydrocarbon structure, but the total carbon number thereof is preferably from 5 to 40, more preferably from 7 to 30.

The polycyclic alicyclic hydrocarbon structure in the group having a polycyclic alicyclic hydrocarbon structure means a structure having a plurality of monocyclic alicyclic hydrocarbon groups, or an alicyclic hydrocarbon structure of a polycyclic type, and may be a crosslinked structure. The monocyclic alicyclic hydrocarbon group is preferably a cycloalkyl group having a carbon number of 3 to 8, and examples thereof include a cyclopropyl group, a cyclopentyl group, a cyclohexyl group, a cyclobutyl group and a cyclooctyl group. The structure having a plurality of monocyclic alicyclic hydrocarbon groups has a plurality of such groups. The structure having a plurality of monocyclic alicyclic hydrocarbon groups preferably has 2 to 4 monocyclic alicyclic hydrocarbon groups, more preferably 2 monocyclic alicyclic hydrocarbon groups.

The alicyclic hydrocarbon structure of a polycyclic type includes, for example, a bicyclo-, tricyclo- or tetracyclo-structure having a carbon number of 5 or more and is preferably a polycyclic cyclo-structure having a carbon number of 6 to 30, and examples thereof include an adamantane structure, a decalin structure, a norbornane structure, a cedrol structure, an isobornane structure, a bornane structure, a bicyclopentane structure, a bicyclohexane structure, a bicycloheptane structure, a bicyclooctane structure, a bicyclodecane structure, a bicyclododecane structure, an α-pinene structure, a tricyclodecane structure, a tetracyclododecane structure and an androstane structure. Incidentally, a part of carbon atoms in the monocyclic or polycyclic cycloalkyl group may be substituted with a heteroatom such as oxygen atom.

The polycyclic alicyclic hydrocarbon structure is preferably an adamantane structure, a decalin structure, a norbornane structure, a cedrol structure, a bicyclohexane structure, a bicycloheptane structure, a bicyclooctane structure, a bicyclodecane structure, a bicyclododecane structure or a tricyclodecane structure, and most preferably an adamantane structure in view of dry etching resistance. Chemical formulae of these polycyclic alicyclic hydrocarbon structures (with respect to the structure having a plurality of monocyclic alicyclic hydrocarbon groups, the monocyclic alicyclic hydrocarbon structure corresponding to the monocyclic alicyclic hydrocarbon group (specifically, structures of the following formulae (47) to (50))) are illustrated below.

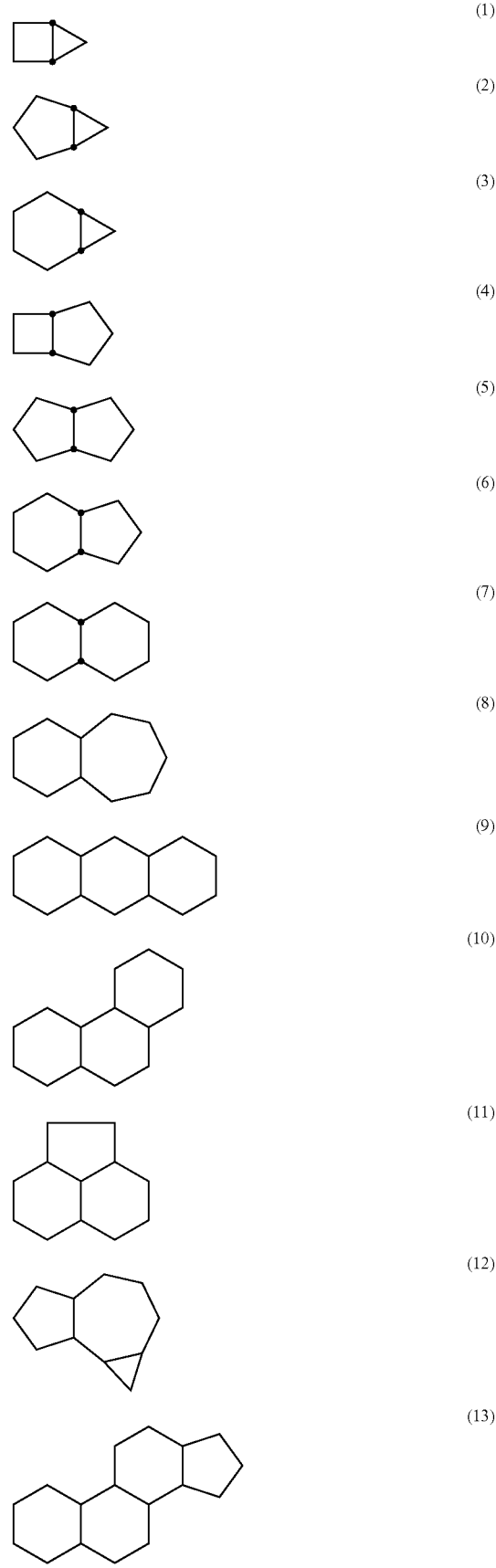

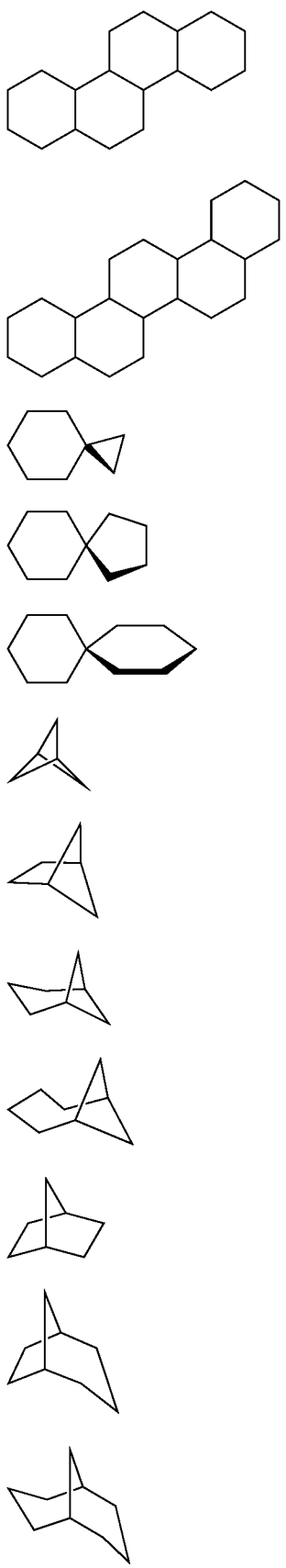
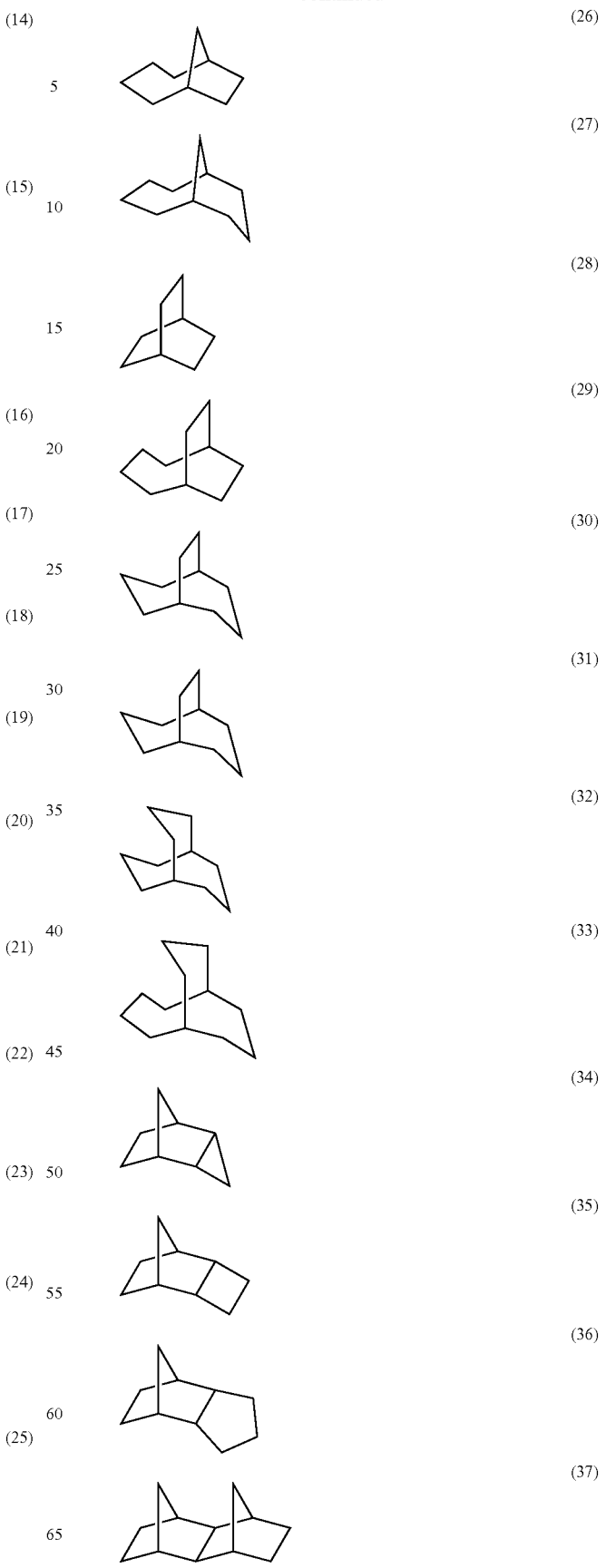

-continued

(38) 

(39) 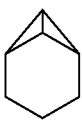

(40) 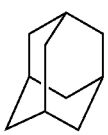

(41) 

(42) 

(43) 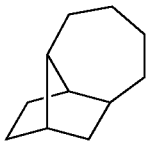

(44) 

(45) 

(46) 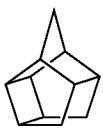

(47) 

(48) 

(49) 

(50) 

The polycyclic alicyclic hydrocarbon structure may further have a substituent, and examples of the substituent include an alkyl group (preferably having a carbon number of 1 to 4), a halogen atom (preferably a fluorine atom and a chlorine atom), a hydroxyl group, an alkoxy group (preferably having a carbon number of 1 to 4), a carboxyl group, a carbonyl group and an alkoxycarbonyl group (preferably having a carbon number of 2 to 5).

m is preferably an integer of 1 to 5 and most preferably 1. When m is 1 and Ar is a benzene ring, the substitution position of —OX may be a para-position, a meta-position or an ortho-position with respect to the bonding position of the benzene ring to the polymer main chain but is preferably a para-position.

In the present invention, the repeating unit represented by formula (1) is preferably a repeating unit represented by the following formula (2).

When a polymer compound having a repeating unit represented by formula (2) is used, Tg of the polymer compound is high and a very hard resist film is formed, so that the acid diffusion or dry etching resistance can be more unfailingly controlled.

$$\text{—(CH}_2\text{—C)—} \quad \begin{array}{c} R_1 \\ | \\ \end{array} \quad (2)$$

(with benzene ring bearing —O—Y—X$_2$)

(wherein $R_1$ represents a hydrogen atom or a methyl group, Y represents a single bond or a divalent linking group, and $X_2$ represents a non-acid-decomposable polycyclic alicyclic hydrocarbon group).

Preferred embodiments of the repeating unit represented by formula (2) for use in the present invention are described below.

In formula (2), $R_1$ represents a hydrogen atom or a methyl group and is preferably a hydrogen atom.

In formula (2), Y is preferably a divalent linking group. The divalent linking group of Y is preferably a carbonyl group, a thiocarbonyl group, an alkylene group (preferably having a carbon number of 1 to 10, more preferably a carbon number of 1 to 5), a sulfonyl group, —COCH$_2$—, —NH— or a divalent linking group composed of a combination thereof (preferably having a total carbon number of 1 to 20, more preferably a total carbon number of 1 to 10), more preferably a carbonyl group, a sulfonyl group, —CONH— or —CSNH—, still more preferably a carbonyl group.

$X_2$ represents a polycyclic alicyclic hydrocarbon group and is non-acid-decomposable. This polycyclic alicyclic hydrocarbon group is a group having a plurality of monocyclic alicyclic hydrocarbon groups, or an alicyclic hydrocarbon group of a polycyclic type, and may be a crosslinked group. The monocyclic alicyclic hydrocarbon group is preferably a cycloalkyl group having a carbon number of 3 to 8, and examples thereof include a cyclopropyl group, a cyclopentyl group, a cyclohexyl group, a cyclobutyl group and a cyclooctyl group. The group has a plurality of such groups. The group having a plurality of monocyclic alicyclic hydrocarbon groups preferably has 2 to 4 monocyclic alicyclic hydrocarbon groups, more preferably 2 monocyclic alicyclic hydrocarbon groups. The alicyclic hydrocarbon group of a polycyclic type includes a group containing, for example, a bicyclo-, tricyclo- or tetracyclo-structure having a carbon number of 5 or more and is preferably a group containing a polycyclic cyclo-structure having a carbon number of 6 to 30, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the monocyclic or polycyclic cycloalkyl group may be substituted with a heteroatom such as oxygen atom.

The polycyclic alicyclic hydrocarbon group of $X_2$ is preferably an adamantyl group, a decalin group, a norbornyl group, a cedrol group, a bicyclohexyl group, a bicycloheptyl group, a bicyclooctyl group, a bicyclodecanyl group, a bicyclododecanyl group or a tricyclodecanyl group, and most preferably an adamantyl group in view of dry etching resistance. Chemical formulae of these preferred $X_2$ are the same as chemical formulae of the polycyclic alicyclic hydrocarbon structures in the group having a polycyclic alicyclic hydrocarbon structure.

The alicyclic hydrocarbon group may further have a substituent, and examples of the substituent include an alkyl group (preferably having a carbon number of 1 to 4), a halogen atom (preferably a fluorine atom and a chlorine atom), a hydroxyl group, an alkoxy group (preferably having a carbon number of 1 to 4), a carboxyl group, a carbonyl group and an alkoxycarbonyl group (preferably having a carbon number of 2 to 5).

In formula (2), the substitution position of —O—Y—$X_2$ may be a para-position, a meta-position or an ortho-position with respect to the bonding position of the benzene ring to the polymer main chain but is preferably a para-position.

In the present invention, the repeating unit represented by formula (2) is most preferably a repeating unit represented by the following formula (2'):

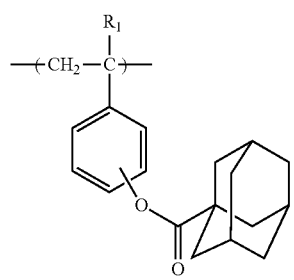

(2')

(wherein $R_1$ represents a hydrogen atom or a methyl group).

In formula (2'), $R_1$ represents a hydrogen atom or a methyl group and is preferably a hydrogen atom.

In formula (2'), the substitution position of the adamantyl ester group may be a para-position, a meta-position or an ortho-position with respect to the bonding position of the benzene ring to the polymer main chain but is preferably a para-position.

Specific examples of the repeating unit represented by formula (1), (2) or (2') include the followings.

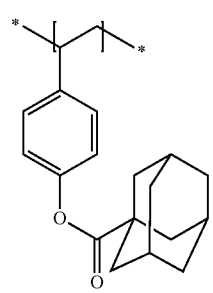

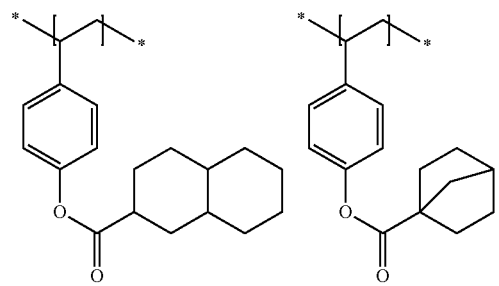

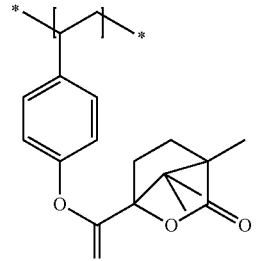

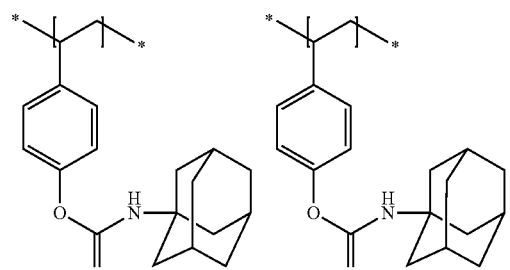

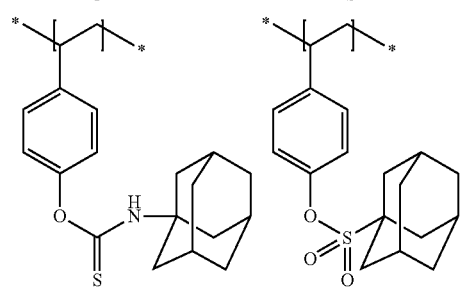

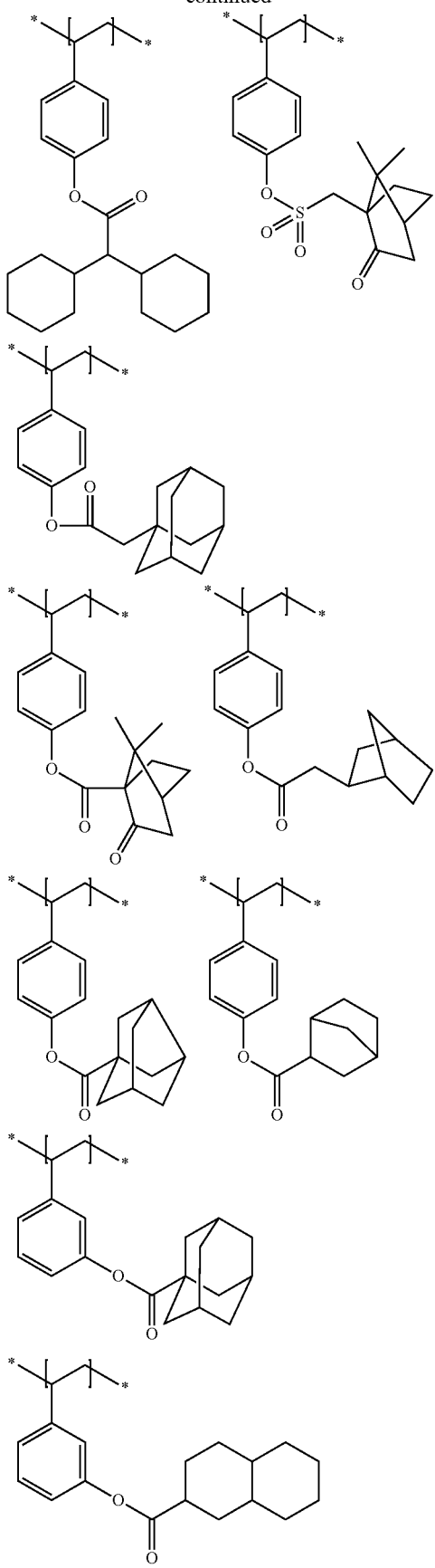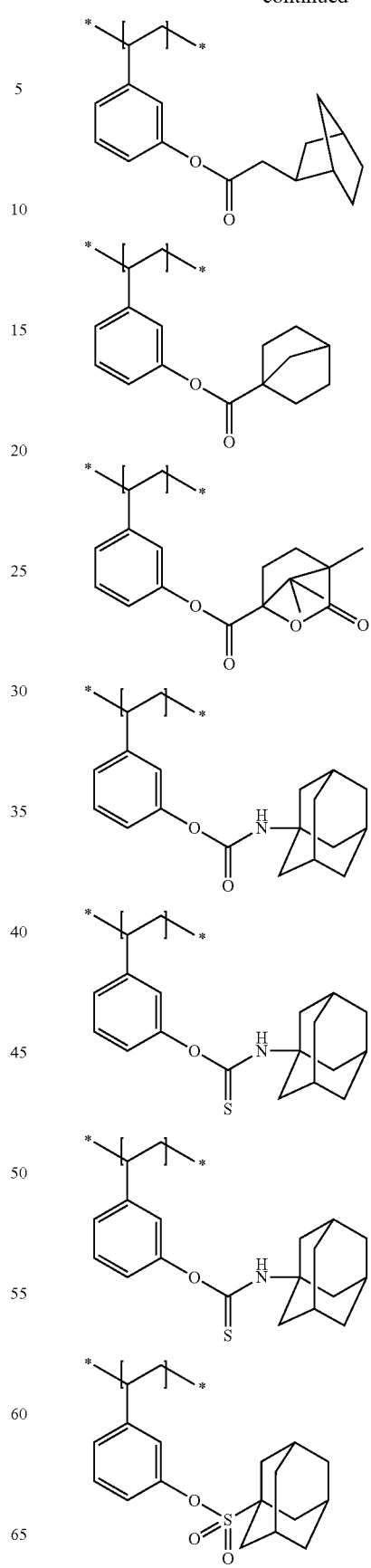

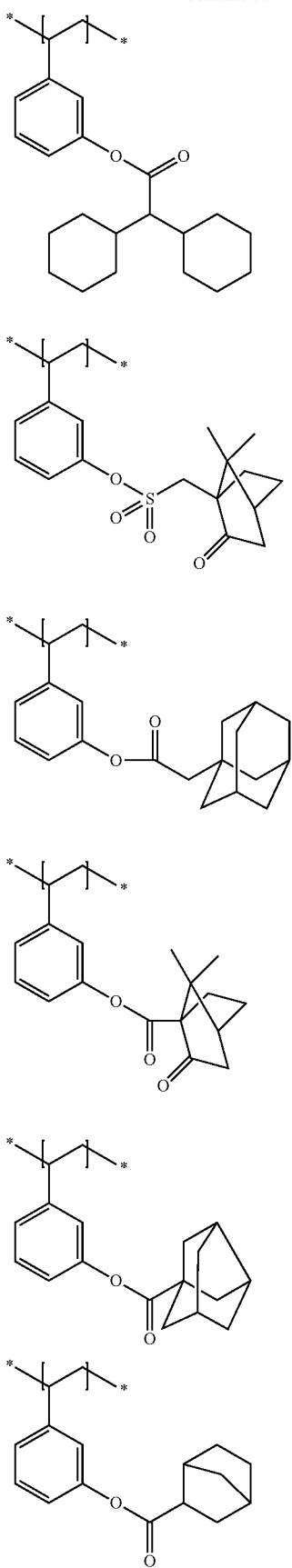
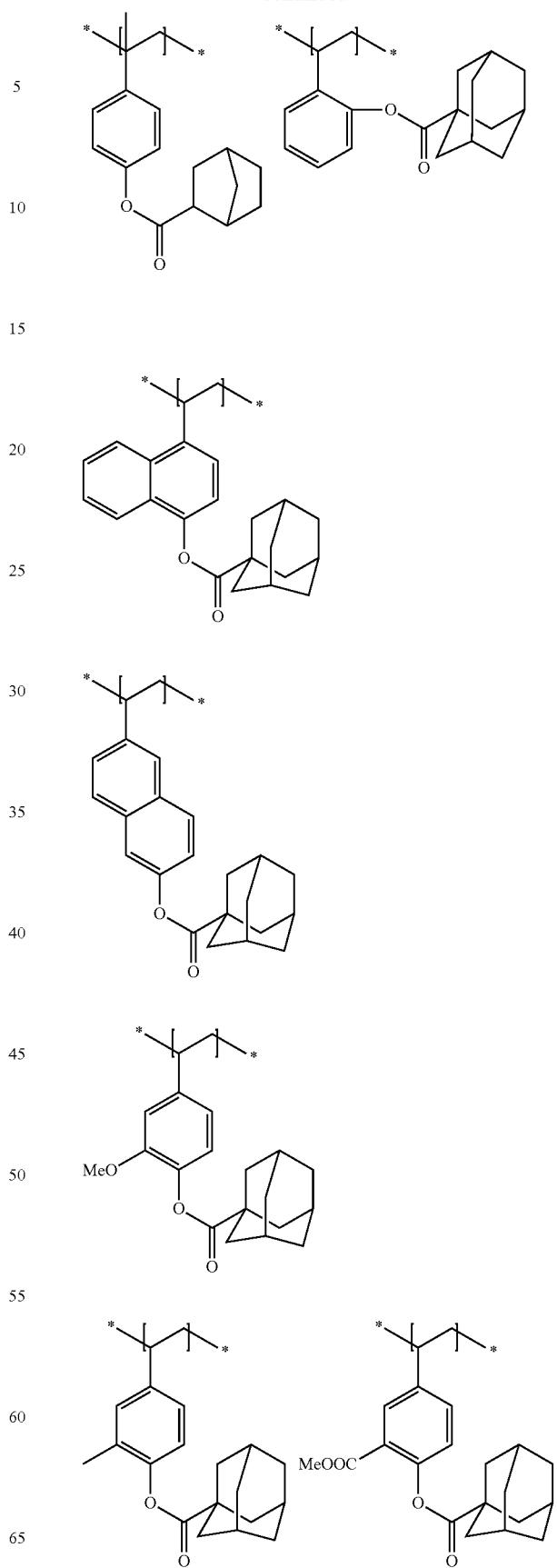

-continued

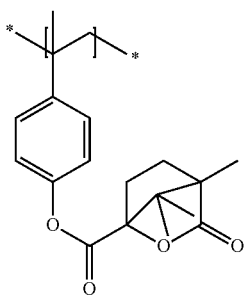

The polymer compound (A) for use in the present invention preferably further contains a repeating unit represented by the following formula (3), in addition to the repeating unit represented by formula (1), (2) or (2').

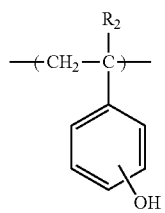
(3)

(wherein $R_2$ represents a hydrogen atom or a methyl group).

With respect to the repeating unit represented by formula (3), preferred compounds for use in the present invention are described below.

In formula (3), $R_2$ represents a hydrogen atom or a methyl group and is preferably a hydrogen atom.

In the hydroxystyrene repeating unit represented by formula (3), the bonding position of the hydroxyl group on the benzene ring may be a para-position, a meta-position or an ortho-position with respect to the bonding position of the benzene ring to the polymer main chain but is preferably a para-position or a meta-position.

In formula (3), the benzene ring on which a hydroxyl group is substituted may have a substituent other than the hydroxyl group, and specific examples and preferred examples of the substituent are the same as specific examples and preferred examples of the substituent which may be substituted on the aromatic ring of Ar in formula (1). In formula (3), the benzene ring on which a hydroxyl group is substituted preferably has no substituent other than the hydroxyl group.

As the repeating unit represented by formula (3), the followings are preferred.

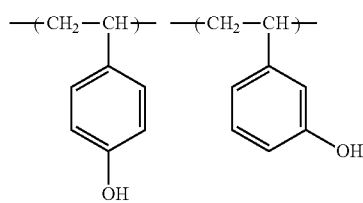

-continued

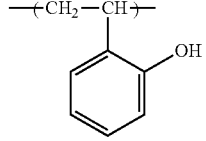

The polymer compound (A) for use in the present invention may also have at least one of the repeating units represented by the following formulae (4A) to (4C), together with the repeating unit represented by formula (1), (2) or (2') and the repeating unit represented by formula (3):

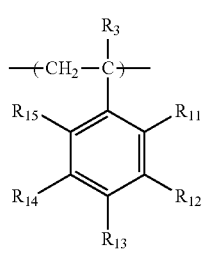
(4A)

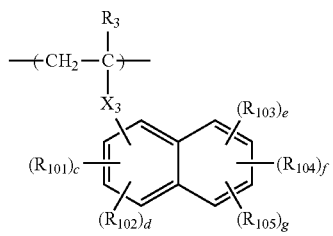
(4B)

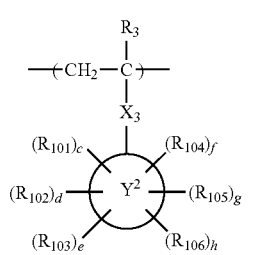
(4C)

In formulae (4A) to (4C), $R_3$ represents a hydrogen atom or a methyl group. $R_3$ is preferably a hydrogen atom.

$X_3$ represents a single bond, a —COO— group, an —O— group, or a —CON($R_{16}$)— group, wherein $R_{16}$ represents a hydrogen atom or an alkyl group (preferably an alkyl group having a carbon number of 1 to 3, such as methyl group, ethyl group or propyl group). $X_3$ is preferably a single bond, a —COO— group or a —CON($R_{16}$)— group, more preferably a single bond or a —COO— group.

The ring structure represented by $Y_2$ is a tricyclic or higher polycyclic aromatic hydrocarbon ring structure and is preferably a structure represented by any one of the following structural formula:

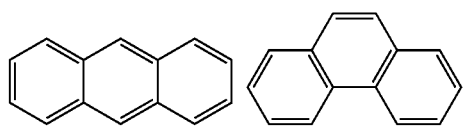

-continued

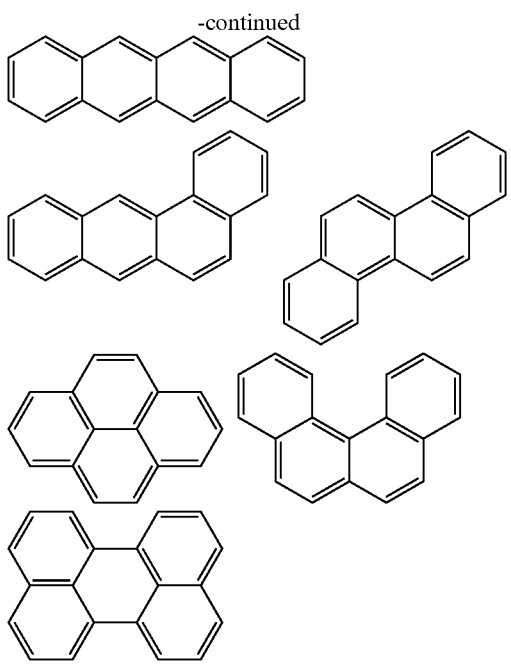

Each of $R_{11}$ to $R_{15}$ independently represents a hydrogen atom, a halogen atom (preferably a fluorine atom or a chlorine atom), an alkyl group (preferably having a carbon number of 1 to 4), a cycloalkyl group (preferably having a carbon number of 3 to 10), an aryl group (preferably having a carbon number of 6 to 20), an alkenyl group (preferably having a carbon number of 2 to 5), an aralkyl group (preferably having a carbon number of 7 to 21), an alkoxy group (preferably having a carbon number of 1 to 4), or an alkylcarbonyloxy group (preferably having a carbon number of 2 to 5. Incidentally, each of $R_{11}$ to $R_{15}$ may combine with a carbon atom of the main chain to form a ring structure.

In the case where each of $R_{11}$ to $R_{15}$ combines with a carbon atom of the main chain to form a ring structure, the ring structure formed is preferably a 4- to 6-membered ring.

Each of $R_{101}$ to $R_{106}$ independently represents a hydroxy group, a halogen atom (e.g., Cl, Br, F, I), a linear or branched alkyl group having a carbon number of 1 to 8, which may have a substituent, a linear or branched alkoxy group having a carbon number of 1 to 8, which may have a substituent, a linear or branched alkylcarbonyloxy group having a carbon number of 2 to 8, which may have a substituent, a linear or branched alkylsulfonyloxy group having a carbon number of 1 to 8, which may have a substituent, an alkenyl group having a carbon number of 2 to 8, which may have a substituent, an aryl group having a carbon number of 6 to 15, which may have a substituent, an aralkyl group having a carbon number of 7 to 16, which may have a substituent, a carboxy group, or a perfluoroalkyl group having a carbon number of 1 to 4, which may have a hydroxyl group. Incidentally, each of $R_{101}$ to $R_{106}$ may combine with a carbon atom of the main chain to form a ring structure.

Each of c to h independently represents an integer of 0 to 3.

Each of $R_{101}$ to $R_{106}$ is independently preferably a hydrogen atom, a halogen atom, an alkyl group having a carbon number of 1 to 4, which may have a substituent, an alkoxy group having a carbon number of 1 to 4, which may have a substituent, or an alkylcarbonyloxy group having a carbon number of 2 to 4, which may have a substituent, more preferably a hydrogen atom, a chlorine atom, a bromine atom, an iodine atom, an alkyl group having a carbon number of 1 to 3 (e.g., methyl, ethyl, propyl, isopropyl), an alkoxy group having a carbon number of 1 to 3 (e.g., methoxy, ethoxy, propyloxy, isopropyloxy), or an alkylcarbonyloxy group having a carbon number of 2 or 3 (e.g., acetyl, propionyl).

In the case where each of $R_{101}$ to $R_{106}$ combines with a carbon atom of the main chain to form a ring structure, the ring structure formed is preferably a 4- to 6-membered ring.

Each of c to h independently represents an integer of preferably 0 or 1, more preferably 0.

As the repeating unit other than those described above, it is also possible to contain a repeating unit having a group capable of generating an acid upon irradiation with an actinic ray or radiation (photoacid generating group).

Examples of such a repeating unit include the repeating units described in paragraph of JP-A-9-325497 and the repeating units described in paragraphs [0038] to [0041] of JP-A-2009-93137. In this case, the repeating unit having a photoacid generating group can be considered to come under the compound (B) capable of generating an acid upon irradiation with an actinic ray or radiation for use in the present invention.

Specific examples of the monomer corresponding to the repeating unit having a photoacid generating group (shown as the structure of the acid generated upon EB or EUV exposure) are illustrated below.

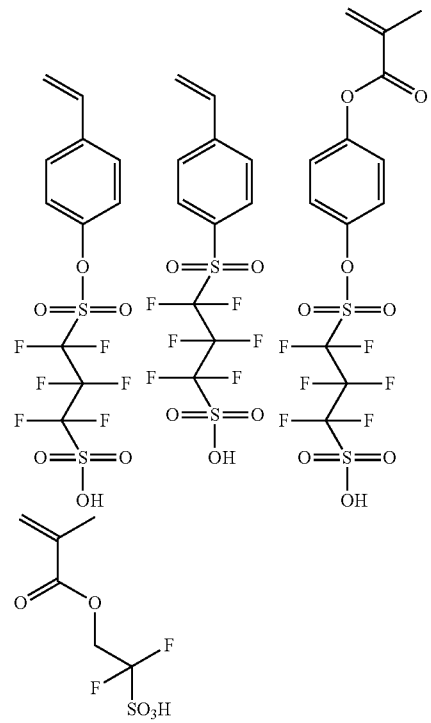

In the case where the polymer compound contains a repeating unit having a photoacid generating group, the content of the repeating unit having a photoacid generating compound is preferably from 1 to 40 mol %, more preferably from 5 to 35 mol %, still more preferably from 5 to 30 mol %, based on all repeating units in the polymer compound (A).

In the polymer compound (A) for use in the present invention, the content of the repeating unit having a structure where a hydrogen atom of a phenolic hydroxyl group is replaced by a group having a non-acid-decomposable polycyclic alicyclic hydrocarbon structure (that is, the repeating unit represented by formula (1), (2) or (2')) is generally from 1 to 40 mol %, preferably from 2 to 30 mol %, based on all repeating units constituting the polymer compound (A).

In the case where the polymer compound (A) contains a repeating unit represented by formula (3), the content of the repeating unit represented by formula (3) is generally from 60 to 99 mol %, preferably from 70 to 98 mol %, based on all repeating units constituting the polymer compound (A).

In the case where the polymer compound (A) contains a repeating unit represented by any one of formulae (4A) to (4C), the content of the repeating unit represented by any one of formulae (4A) to (4C) is generally from 1 to 20 mol %, preferably from 1 to 10 mol %, based on all repeating units constituting the polymer compound (A).

The polymer compound (A) can be synthesized by a known radical polymerization method, anionic polymerization method or living radical polymerization method (e.g., iniferter method). For example, in the anionic polymerization method, vinyl monomers are dissolved in an appropriate organic solvent and reacted usually under cooling condition by using a metal compound (e.g., butyllithium) as the initiator, whereby the polymer can be obtained.

As the polymer compound (A), a polyphenol compound produced by a condensation reaction of an aromatic ketone or aromatic aldehyde and a compound containing from 1 to 3 phenolic hydroxyl groups (see, for example, JP-A-2008-145539), a calixarene derivative (see, for example, JP-A-2004-18421), a Noria derivative (see, for example, JP-A-2009-222920), and a polyphenol derivative (see, for example, JP-A-2008-94782) can be also applied, and these may be modified by a polymer reaction to synthesize the polymer compound.

The polymer compound (A) is preferably synthesized by a polymer reaction of modifying a polymer synthesized by radical polymerization or anionic polymerization.

The weight average molecular weight of the polymer compound (A) is preferably from 1,000 to 200,000, more preferably from 2,000 to 50,000, and most preferably from 2,000 to 10,000.

The polydispersity (molecular weight distribution) (Mw/Mn) of the polymer compound (A) is preferably 1.7 or less and from the standpoint of enhancing the sensitivity and resolution, more preferably from 1.0 to 1.35, most preferably from 1.0 to 1.2. When living polymerization such as living anionic polymerization is employed, the polymer compound obtained can have a uniform polydispersity (molecular weight distribution), and this is preferred. The weight average molecular weight and the polydispersity of the polymer compound (A) are defined as a value in terms of polystyrene by GPC measurement.

Incidentally, the polymer compound (A) is not limited only to a compound obtained by polymerizing monomers corresponding to the above-described specific repeating units, and a relatively low molecular weight compound such as molecular resist may be also used as long as the compound has a structure where a hydrogen atom of a phenolic hydroxyl group is replaced by a group having a non-acid-decomposable polycyclic alicyclic hydrocarbon structure.

The amount of the polymer compound (A) added in the negative chemical amplification resist composition of the present invention is preferably from 30 to 95 mass %, more preferably from 40 to 90 mass %, still more preferably from 50 to 85 mass %, based on the entire solid content of the composition.

Specific examples of the polymer compound (A) for use in the present invention are illustrated below.

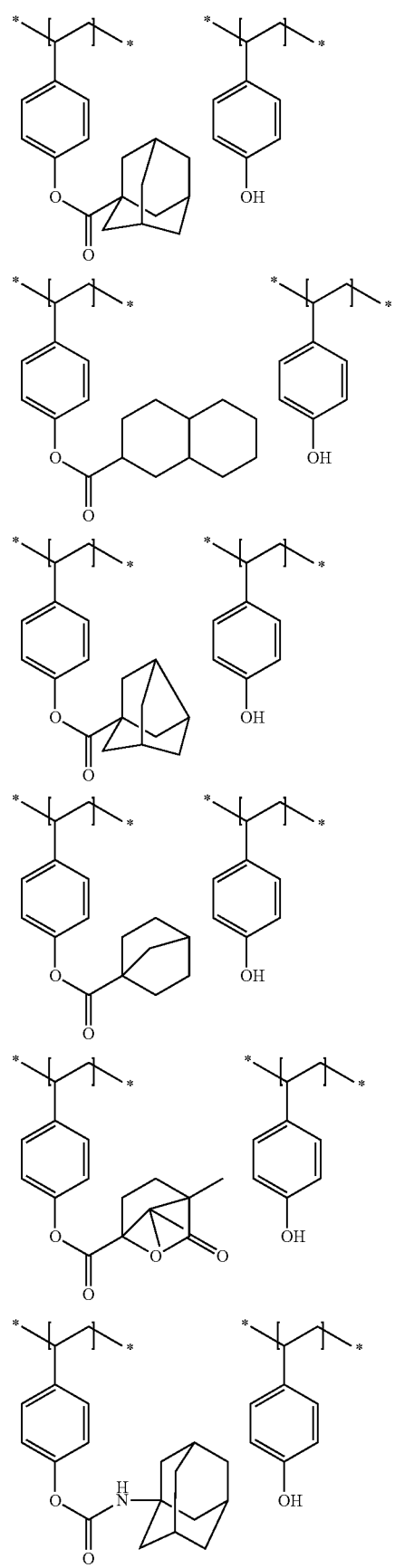

31
-continued
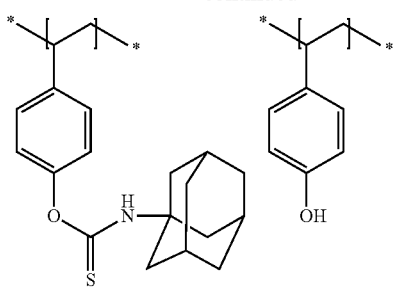
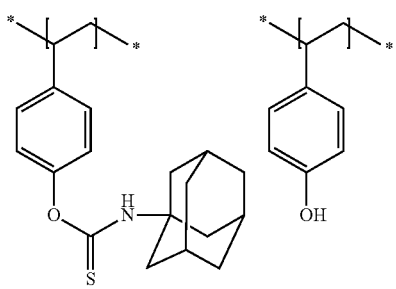
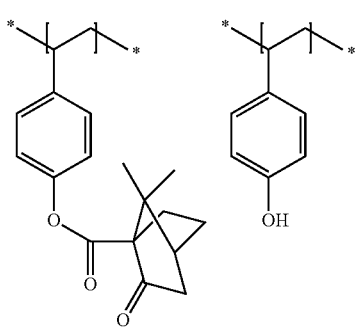
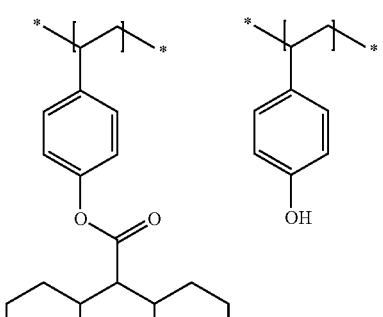
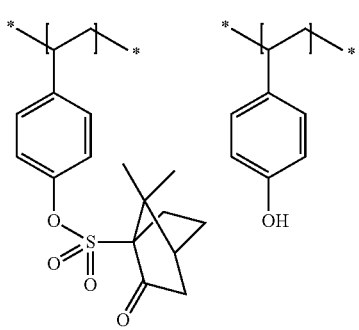
32
-continued
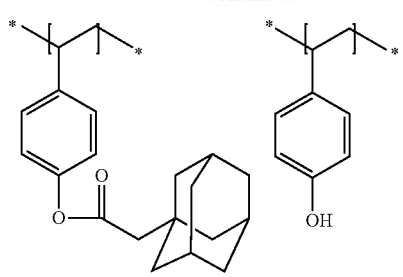
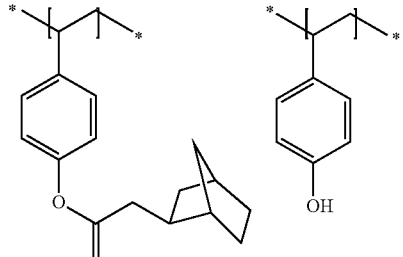
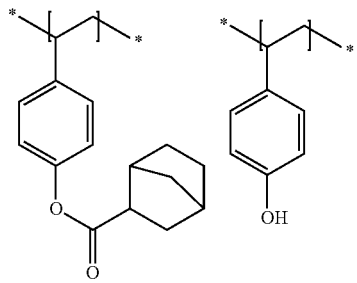
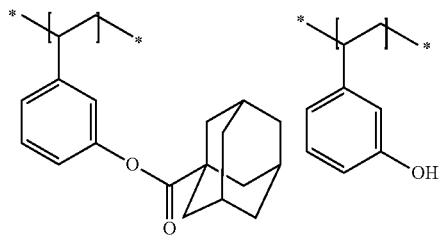
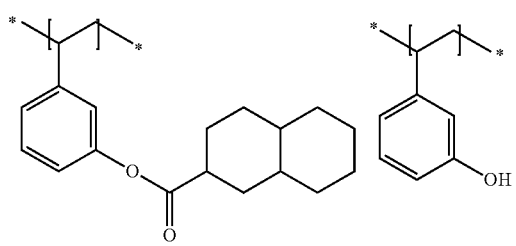
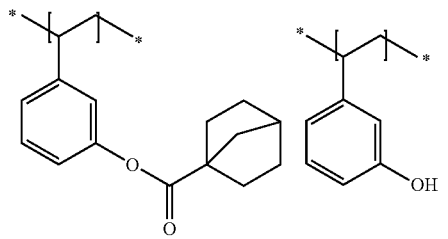

33
-continued
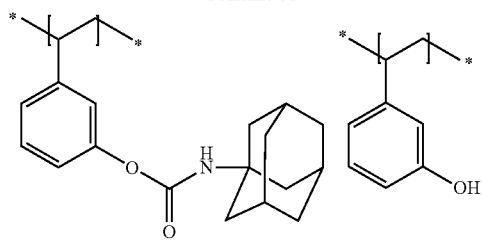
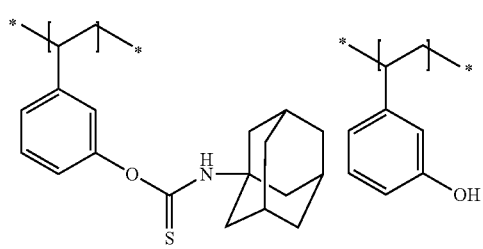
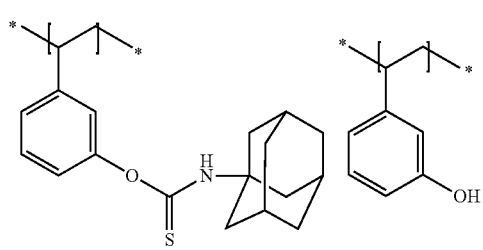
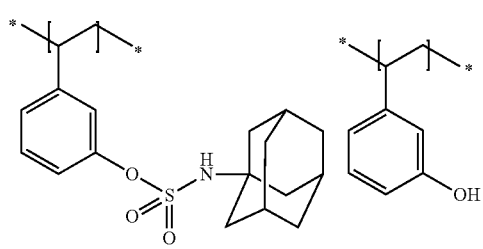
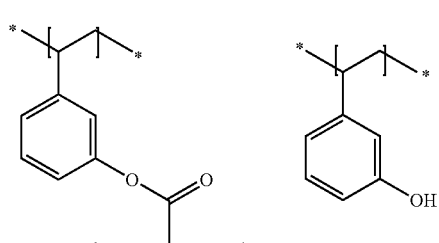
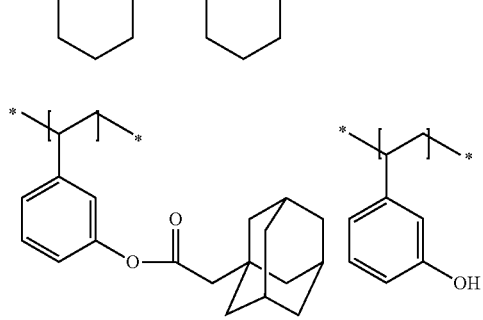
34
-continued
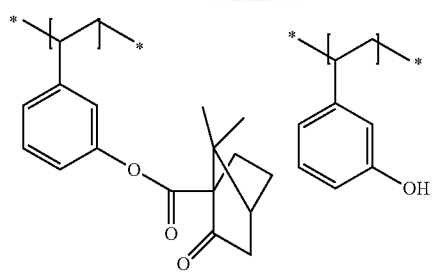
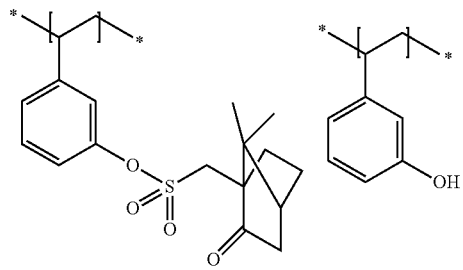
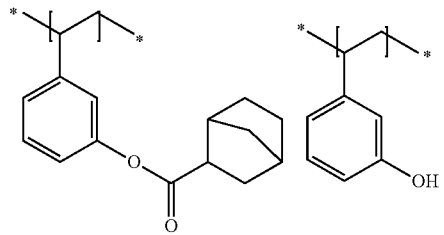
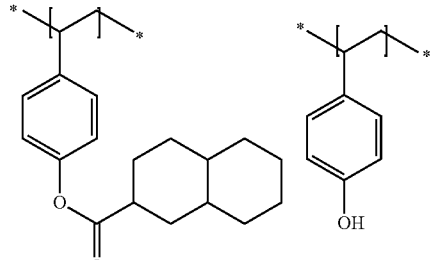
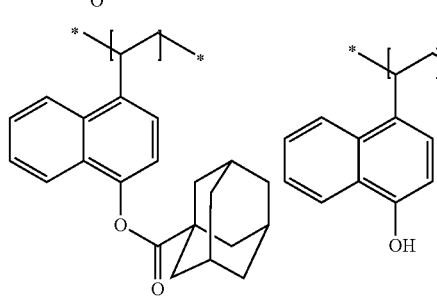
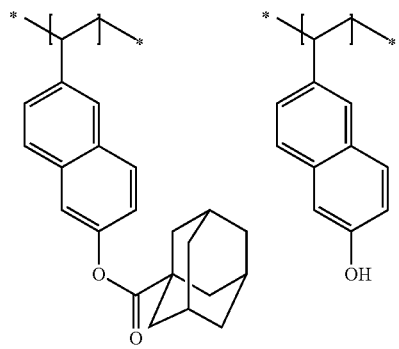

-continued
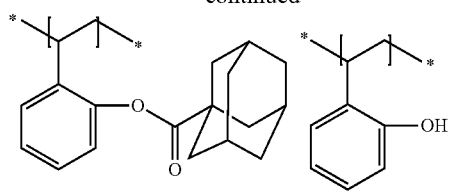
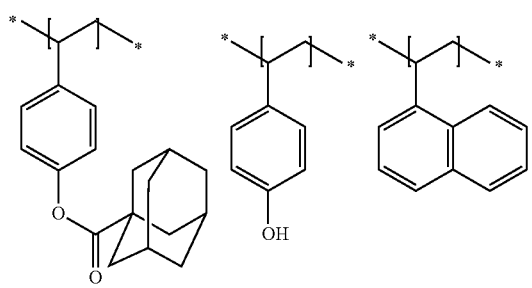
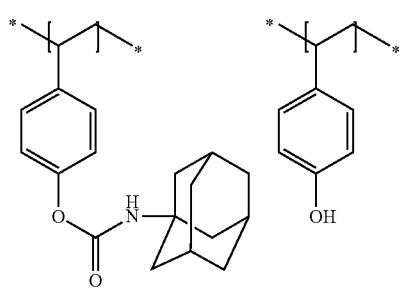
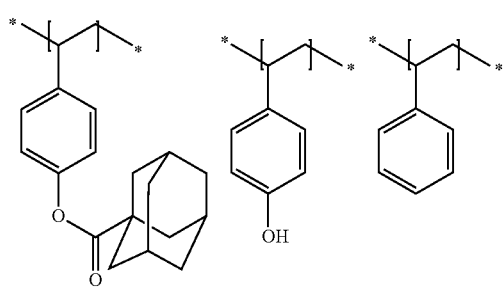
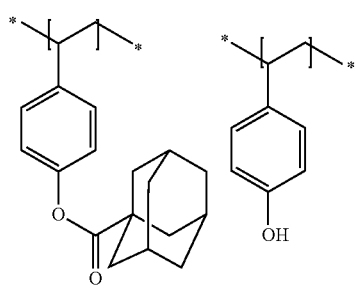
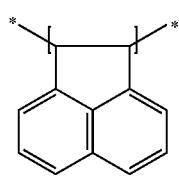
-continued
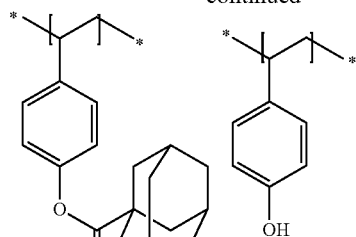
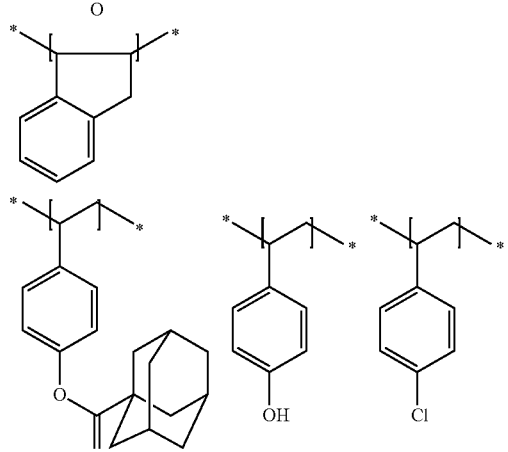
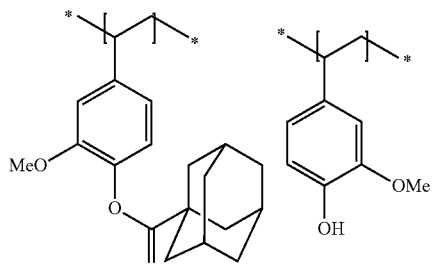
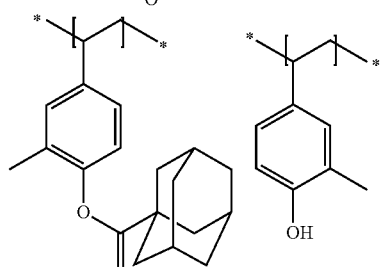
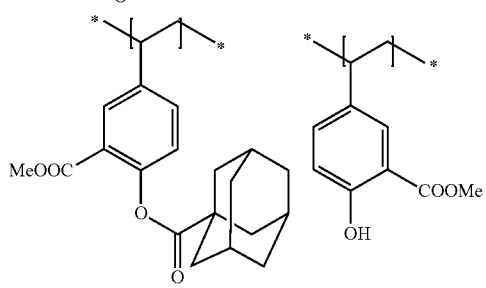
[2] Compound Capable of Generating Acid Upon Irradiation with Actinic Ray or Radiation (B)
The negative chemical amplification resist composition of the present invention contains (B) a compound capable of generating an acid upon irradiation with an actinic ray or radiation (hereinafter such a compound is sometimes simply referred to as an "acid generator").

A preferred embodiment of the acid generator is an onium compound. Examples of the onium compound include a sulfonium salt, an iodonium salt and a phosphonium salt.

Another preferred embodiment of the acid generator is a compound capable of generating a sulfonic acid, an imide acid or a methide acid upon irradiation with an actinic ray or radiation. Examples of the acid generator in this embodiment include a sulfonium salt, an iodonium salt, a phosphonium salt, oxime sulfonate and imidosulfonate.

The acid generator for use in the present invention is not limited to a low molecular compound, and a compound where a group capable of generating an acid upon irradiation with an actinic ray or radiation is introduced into the main or side chain of the polymer compound may be also used. Furthermore, in the case where, as described above, a group capable of generating an acid upon irradiation with an actinic ray or radiation is present in a repeating unit serving as a copolymerization component of the polymer compound (A) for use in the present invention, the acid generator (B) which is a different molecule from the polymer compound of the present invention may not be contained.

The acid generator is preferably a compound capable of generating an acid upon irradiation with an electron beam or EUV light (an extreme-ultraviolet ray).

In the present invention, the onium compound is preferably a sulfonium compound represented by the following formula (5) or an iodonium compound represented by formula (6):

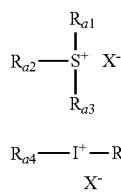

(5)

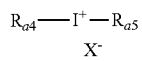

(6)

In formulae (5) and (6), each of $R_{a1}$, $R_{a2}$, $R_{a3}$, $R_{a4}$ and $R_{a5}$ independently represents an organic group, and $X^-$ represents an organic anion.

The sulfonium compound represented by formula (5) and the iodonium compound represented by formula (6) are described in detail below.

Each of $R_{a1}$ to $R_{a3}$ in formula (5) and $R_{a4}$ and $R_{a5}$ in formula (6) independently represents an organic group, but at least one of $R_{a1}$ to $R_{a3}$ and at least one of $R_{a4}$ and $R_{a5}$ each is preferably an aryl group. The aryl group is preferably a phenyl group or a naphthyl group, more preferably a phenyl group.

Examples of the organic anion of $X^-$ in formulae (5) and (6) include a sulfonate anion, a carboxylate anion, a bis(alkylsulfonyl)imide anion and a tris(alkylsulfonyl)methide anion. The organic anion is preferably an organic anion represented by the following formula (7), (8) or (9), more preferably an organic anion represented by the following formula (7):

(7)

(8)

(9)

In formulae (7), (8) and (9), each $Rc_1$, $Rc_2$, $Rc_3$ and $Rc_4$ represents an organic group.

The organic anion of $X^-$ corresponds to a sulfonic acid, an imide acid or a methide acid which are an acid generated upon irradiation with an actinic ray or radiation such as electron beam and extreme-ultraviolet ray.

Examples of the organic group of $R_{c1}$ to $R_{c4}$ include an alkyl group, a cycloalkyl group, an aryl group, and a group formed by combining a plurality of such groups. Among these organic groups, an alkyl group substituted with a fluorine atom or a fluoroalkyl group at the 1-position, a cycloalkyl group substituted with a fluorine atom or a fluoroalkyl group, and a phenyl group substituted with a fluorine atom or a fluoroalkyl group, are preferred. A plurality of organic groups of $R_{c2}$ to $R_{c4}$ may combine with each other to form a ring, and the group formed by combining a plurality of organic groups is preferably an alkylene group substituted with a fluorine atom or a fluoroalkyl group. By having a fluorine atom or a fluoroalkyl group, the acidity of the acid generated upon irradiation with light is increased and the sensitivity is enhanced. However, the terminal group preferably contains no fluorine atom as a substituent.

(z1)

(z2)

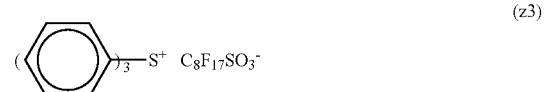

(z3)

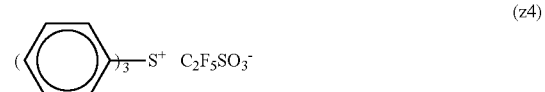

(z4)

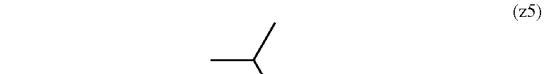

(z5)

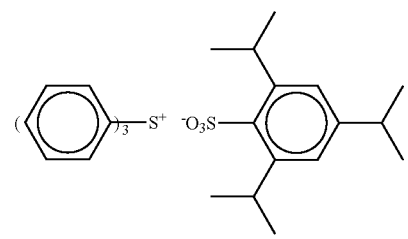

(z6)
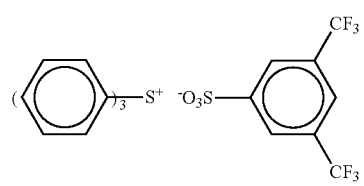
(z7)
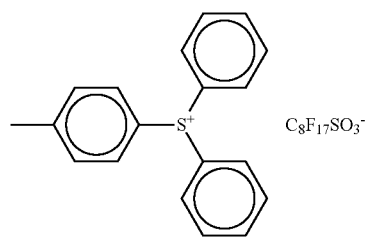
(z8)
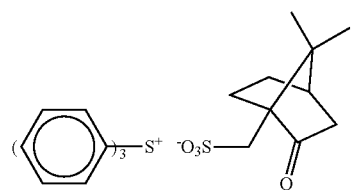
(Z9)
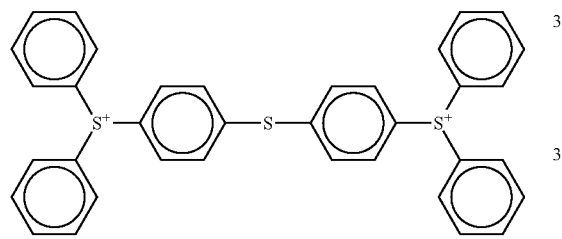
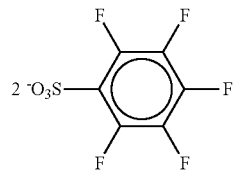
(z10)
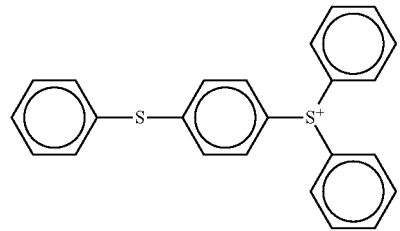
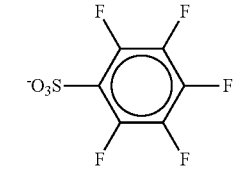
(z11)
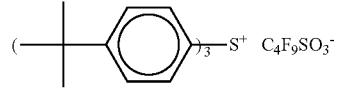
(z12)
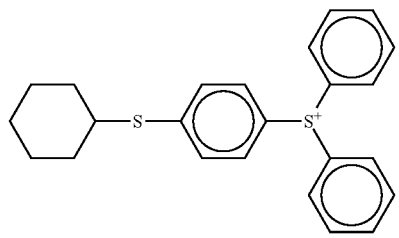
(z13)
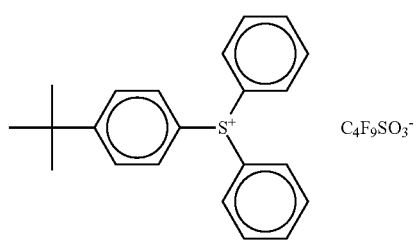
(z14)
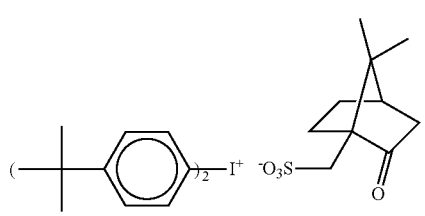
(z15)
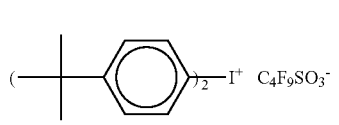
(z16)
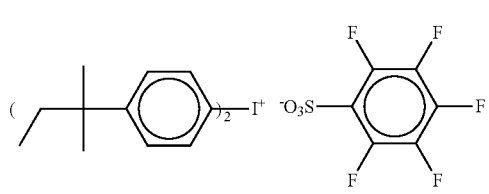
(z17)
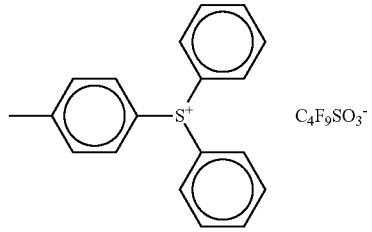
(z18)
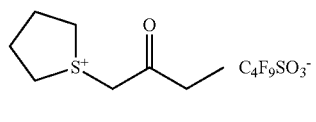
(z19)
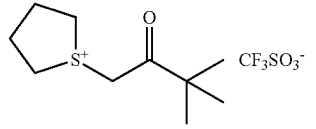

-continued
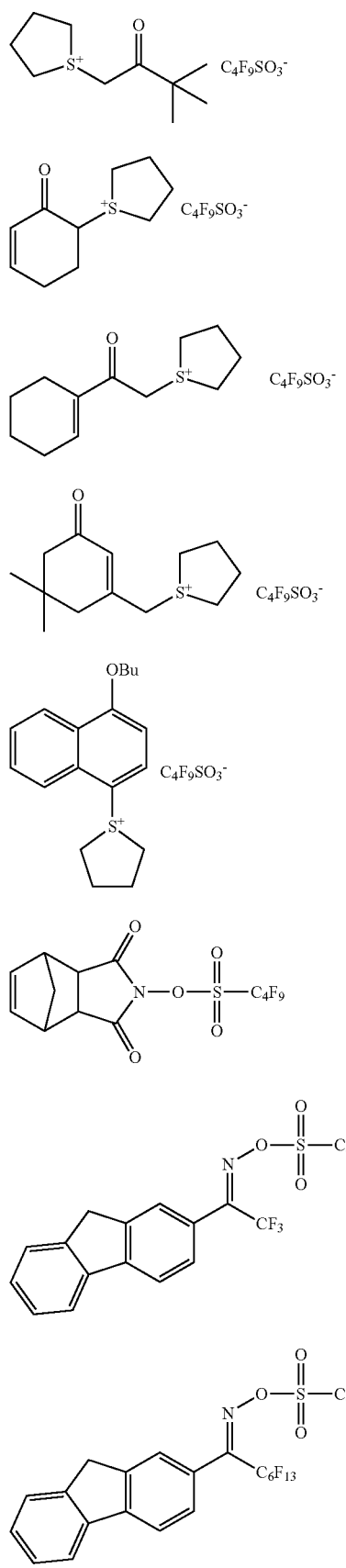
-continued
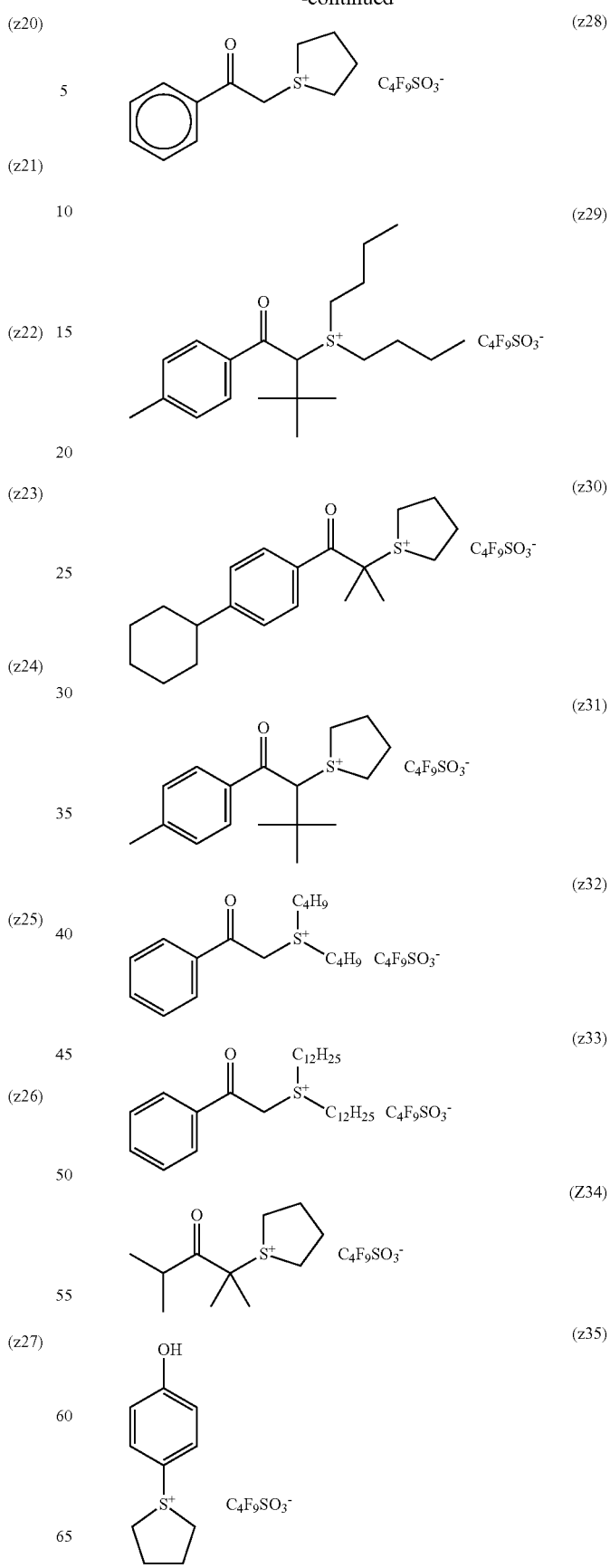

-continued
(z36) 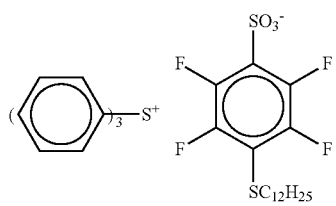
(z37) 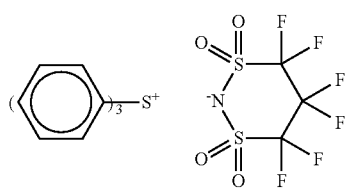
(z38) 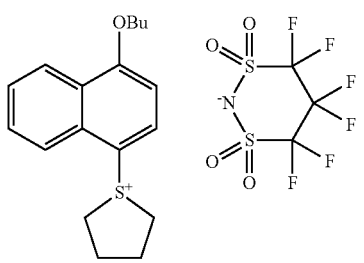
(z39) 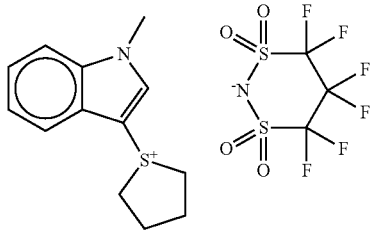
(z40) 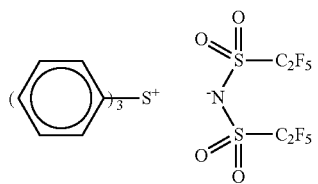
(z41) 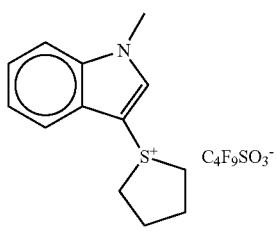
(z42) 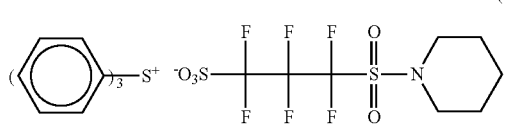
-continued
(z43) 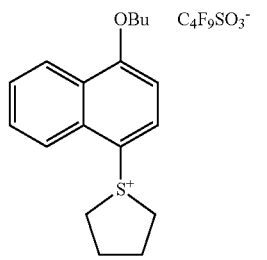
(z44) 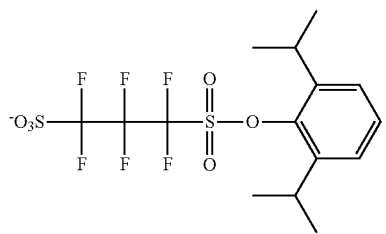
(z45) 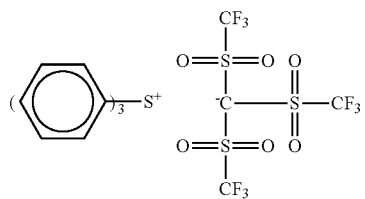
(z46) 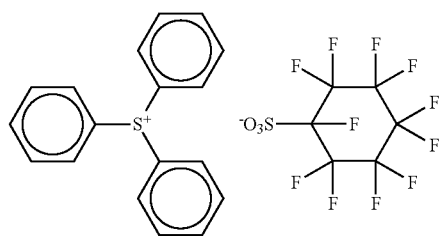
(z47) 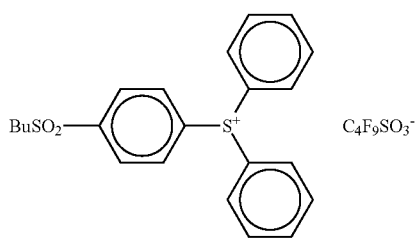
(z48) 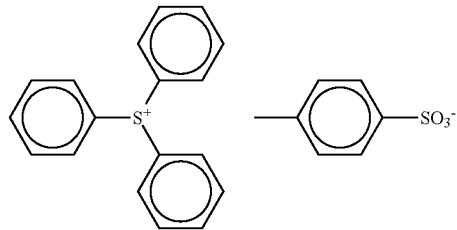

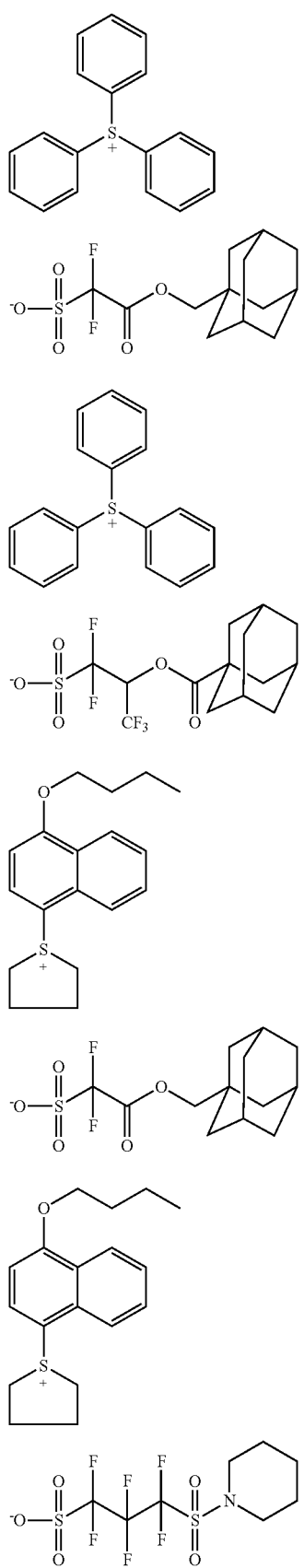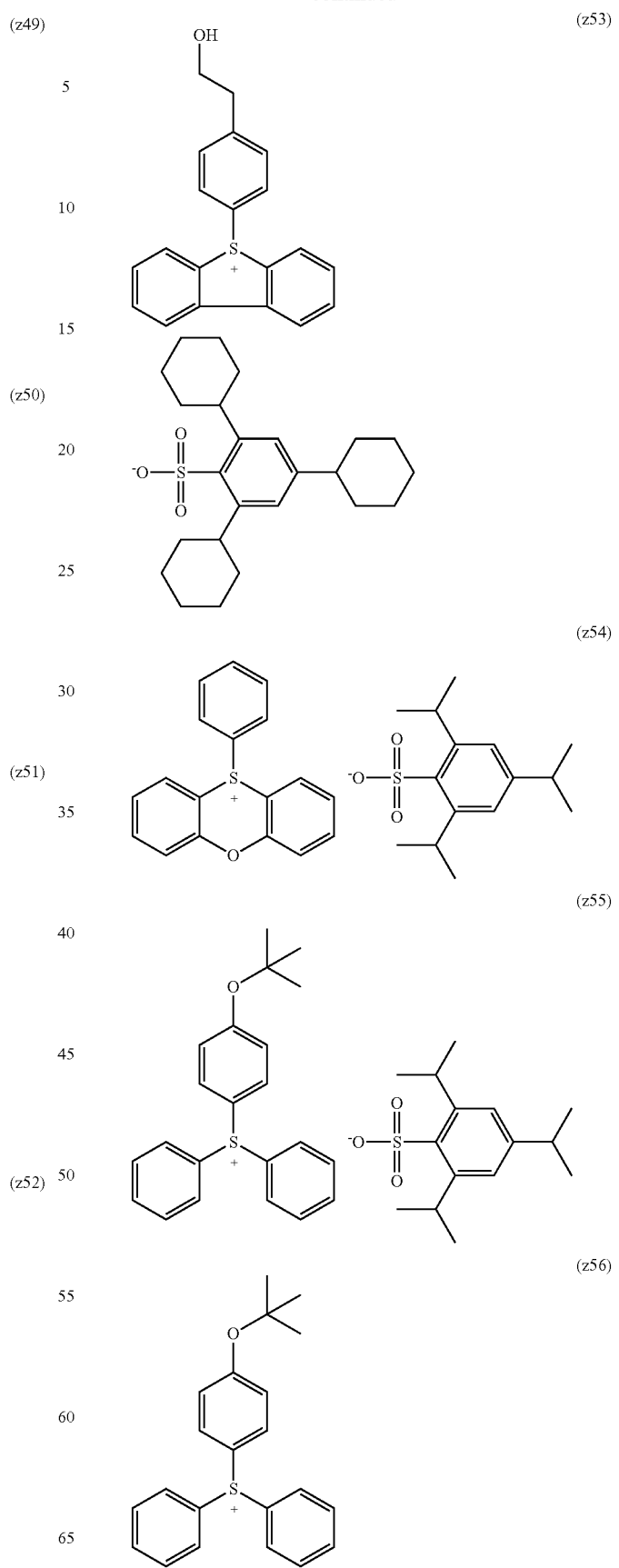

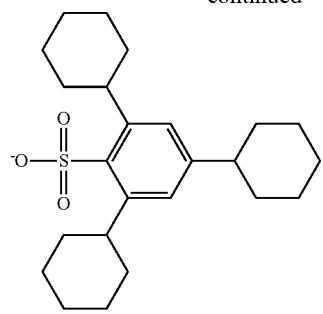
(z57)
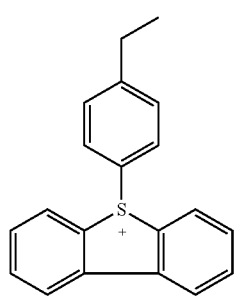
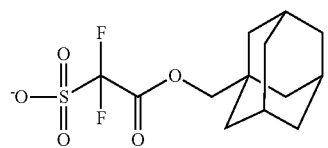
(z58)
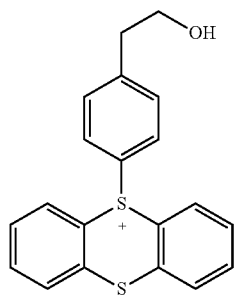
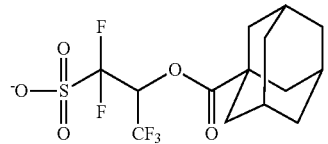
(z59)
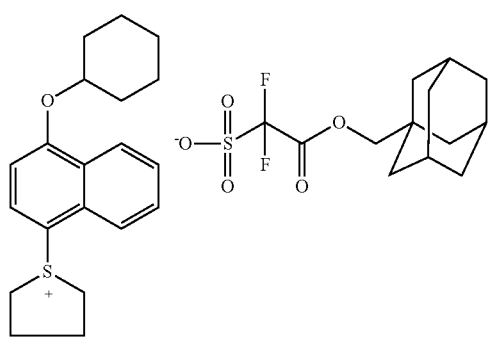
(z60)
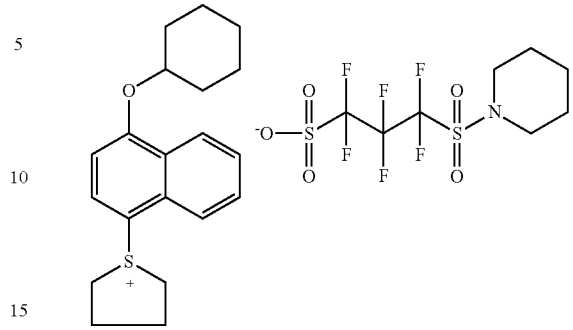
(z61)
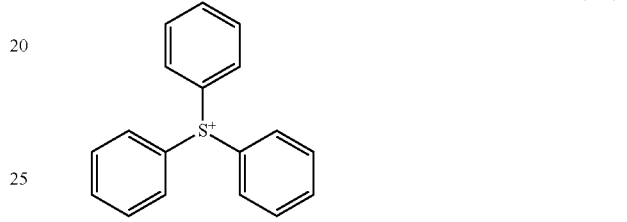
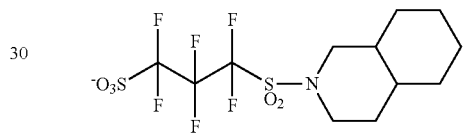
(z62)
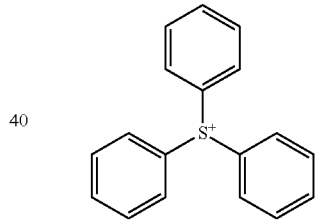
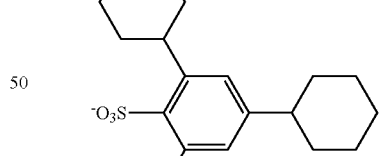
(z63)
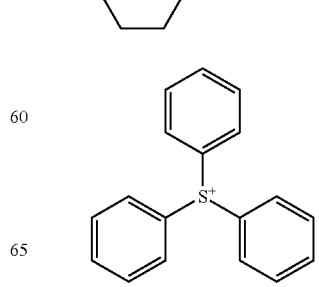

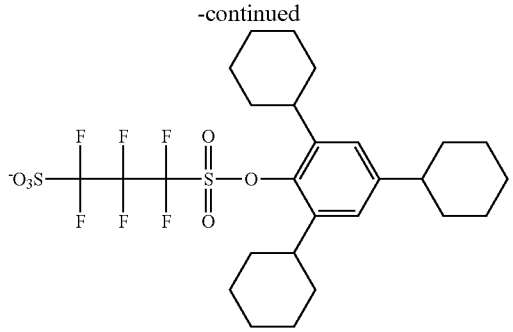

(z64)

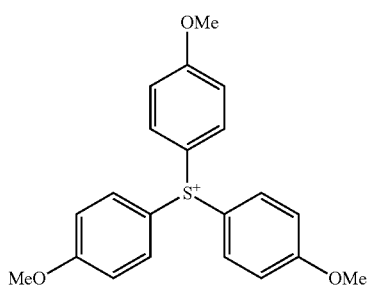

(z65)

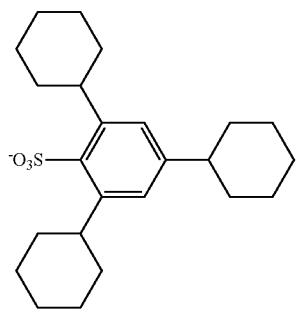

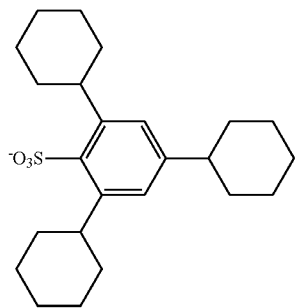

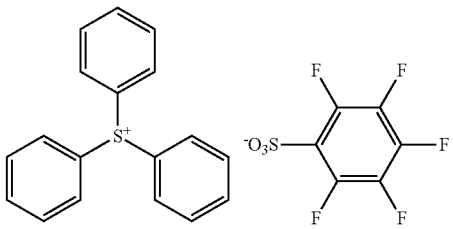

(z66)

As the acid generator (preferably an onium compound) for use in the present invention, a polymer-type acid generator where a group capable of generating an acid upon irradiation with an actinic ray or radiation (photoacid generating group) is introduced into the main or side chain of a polymer compound may be also used.

The content of the acid generator in the negative chemical amplification resist composition is preferably from 0.1 to 25 mass %, more preferably from 0.5 to 20 mass %, still more preferably from 1 to 18 mass %, based on the entire solid content of the negative chemical amplification resist composition.

As for the acid generator, one kind may be used alone, or two or more kinds may be used in combination.

[3] (C) Crosslinking Agent for Crosslinking Polymer Compound (A) by the Action of Acid The negative chemical amplification resist composition of the present invention contains (C) a crosslinking agent for crosslinking the polymer compound (A) by the action of an acid (hereinafter, sometimes referred to as an "acid crosslinking agent" or simply as a "crosslinking agent").

Preferred crosslinking agents include hydroxymethylated or alkoxymethylated phenol compounds, alkoxymethylated melamine compounds, alkoxymethyl glycoluril-based compounds, and acyloxymethylated urea-based compounds. The compound (C) particularly preferred as the crosslinking agent is a phenol derivative having a molecular weight of 1,200 or less and containing, per molecule, from 3 to 5 benzene rings and a total of two or more hydroxymethyl groups or alkoxymethyl groups, a melamine-formaldehyde derivative having at least two free N-alkoxymethyl groups, or an alkoxymethyl glycoluril derivative.

The alkoxymethyl group is preferably a methoxymethyl group or an ethoxymethyl group.

Out of the crosslinking agents above, the phenol derivative having a hydroxymethyl group can be obtained by reacting a corresponding phenol compound having no hydroxymethyl group with formaldehyde in the presence of a base catalyst. Also, the phenol derivative having an alkoxymethyl group can be obtained by reacting a corresponding phenol derivative having a hydroxymethyl group with an alcohol in the presence of an acid catalyst.

Among the thus-synthesized phenol derivatives, a phenol derivative having an alkoxymethyl group is preferred in view of sensitivity and storage stability.

Other preferred examples of the crosslinking agent include compounds having an N-hydroxymethyl group or an N-alkoxymethyl group, such as alkoxymethylated melamine-based compounds, alkoxymethyl glycoluril-based compounds and alkoxymethylated urea-based compound.

Examples of these compounds include hexamethoxymethylmelamine, hexaethoxymethylmelamine, tetramethoxymethyl glycoluril, 1,3-bismethoxymethyl-4,5-bismethoxyethyleneurea, and bismethoxymethylurea, which are disclosed in EP 0,133,216A, German Patents 3,634,671 and 3,711,264, and EP 0,212,482A.
Among these crosslinking agents, particularly preferred are those illustrated below.
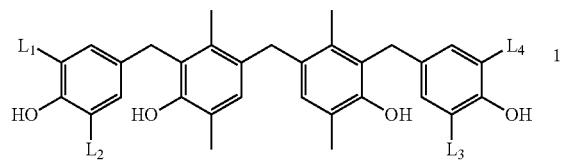
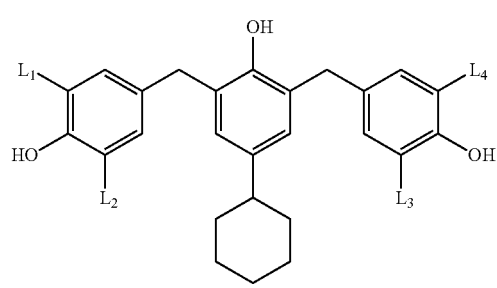
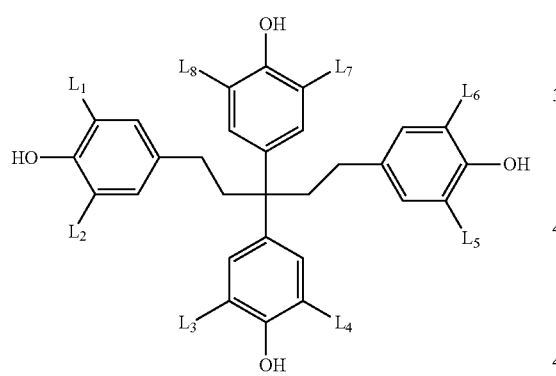
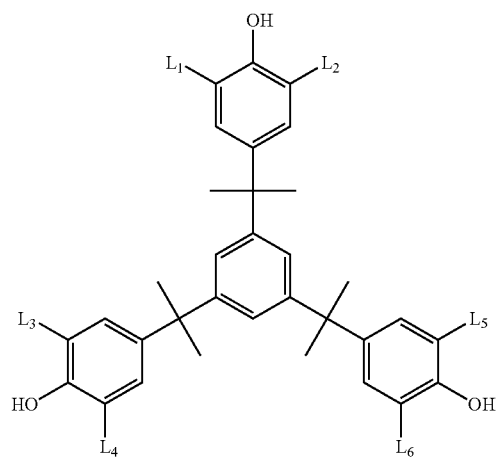
-continued
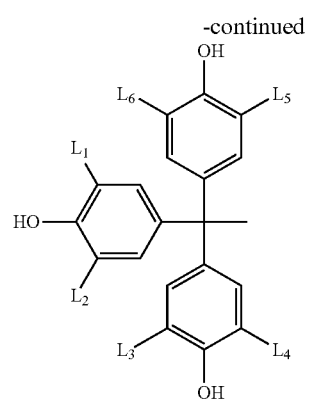
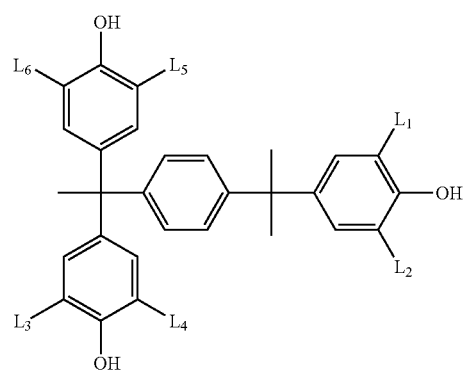
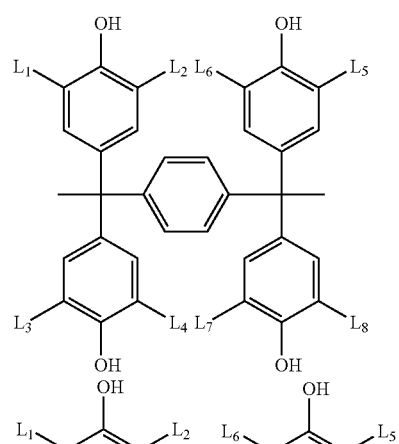
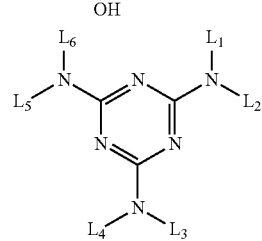

-continued

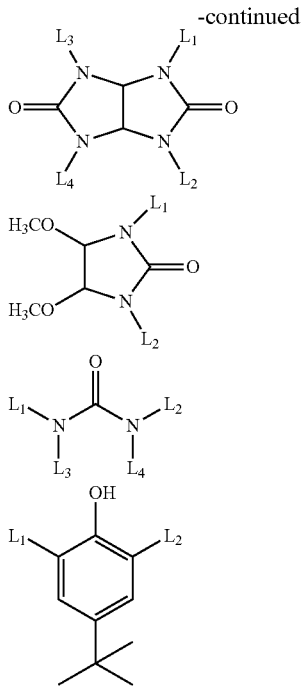

In these formulae, each of $L_1$ to $L_8$ independently represents a hydrogen atom, a hydroxymethyl group, a methoxymethyl group, an ethoxymethyl group or an alkyl group having a carbon number of 1 to 6.

In the present invention, the crosslinking agent (C) is used in an amount added of preferably from 3 to 65 mass %, more preferably from 5 to 50 mass %, based on the solid content of the negative chemical amplification resist composition. When the amount added of the crosslinking agent (C) is from 3 to 65 mass %, the residual film ratio and the resolution can be prevented from decreasing and at the same time, good stability can be kept during storage of the resist solution.

In the present invention, one kind of a crosslinking agent may be used alone, or two or more kinds of crosslinking agents may be used in combination and in view of the pattern profile, two or more kinds of crosslinking agents are preferably used in combination.

For example, in the case of using the phenol derivative and additionally using another crosslinking agent, for example, the above-described compound having an N-alkoxymethyl group, in combination, the ratio between the phenol derivative and another crosslinking agent is preferably, in terms of molar ratio, from 100/0 to 20/80, preferably from 90/10 to 40/60, more preferably from 80/20 to 50/50.

[4] Basic Compound

The negative chemical amplification resist composition of the present invention preferably contains a basic compound as an acid scavenger, in addition to the components described above. By using a basic compound, the change of performance with aging from exposure to post-heating can be reduced. The basic compound is preferably an organic basic compound, and specific examples thereof include aliphatic amines, aromatic amines, heterocyclic amines, nitrogen-containing compounds having a carboxyl group, nitrogen-containing compound having a sulfonyl group, nitrogen-containing compound having a hydroxy group, nitrogen-containing compound having a hydroxyphenyl group, an alcoholic nitrogen-containing compound, amide derivatives, and imide derivatives. An amine oxide compound (for example, compounds described in JP-A-2008-102383) and an ammonium salt (preferably a hydroxide or a carboxylate; more specifically, a tetraalkylammonium hydroxide typified by tetra-n-butyl ammonium hydroxide is preferred in view of LER) may be also appropriately used.

Furthermore, a compound capable of increasing the basicity by the action of an acid can be also used as a kind of the basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, tridodecyl amine, methyldioctadecylamine, N,N-dibutylaniline, N,N-dihexylaniline, 2,6-diisopropylaniline, 2,4,6-tri(tert-butyl)aniline, triethanolamine, N,N-dihydroxyethylaniline, tris(methoxyethoxyethyl) amine, the compounds exemplified in column 3, line 60 et seq. of U.S. Pat. No. 6,040,112, 2-[2-{2-(2,2-dimethoxy-phenoxyethoxy)ethyl}-bis-(2-methoxyethyl)]-amine, and Compounds (C1-1) to (C3-3) illustrated in paragraph [0066] of U.S. Patent Application Publication No. 2007/0224539A1. Examples of the compound having a nitrogen-containing heterocyclic structure include 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]-non-5-ene, 1,8-diazabicyclo[5.4.0]-undec-7-ene, and tetra-n-butyl ammonium hydroxide.

In addition, a photodecomposable basic compound (a compound which initially exhibits basicity due to the action of the basic nitrogen atom as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, the onium salts described in Japanese Patent No. 3,577,743, JP-A-2001-215689, JP-A-2001-166476 and JP-A-2008-102383), and a photobase generator (for example, the compounds described in JP-A-2010-243773) may be also appropriately used.

Among these basic compounds, an ammonium salt is preferred from the standpoint of enhance the resolution.

In the present invention, one kind of a basic compound may be used alone, or two or more kinds of basic compounds may be used in combination.

The content of the basic compound for use in the present invention is preferably from 0.01 to 10 mass %, more preferably from 0.03 to 5 mass %, still more preferably from 0.05 to 3 mass %, based on the entire solid content of the resist composition.

[5] Resist Solvent

Preferred examples of the solvent used for the negative chemical amplification resist composition of the present invention include ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate and ethylene carbonate. These solvents are used individually or in combination.

The negative chemical amplification resist composition is preferably prepared by dissolving the components in the solvent about to give a solid content of, in terms of solid content concentration, from 1 to 40 mass %, more preferably from 1 to 30 mass %, still more preferably from 3 to 20 mass %.

[6] Surfactant

The negative chemical amplification resist composition of the present invention may further contain a surfactant so as to enhance the coatability. The surfactant is not particularly limited, but examples thereof include a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters, a fluorine-containing surfactant such as Megaface F171, F176 (produced by Dainippon Ink & Chemicals, Inc.), Florad FC430 (produced by Sumitomo 3M, Inc.), Surfynol E1004 (produced by Asahi Glass Co., Ltd.), and PF656 and PF6320 produced by OMNOVA, and an organosiloxane polymer.

In the case where the negative chemical amplification resist composition contains a surfactant, the amount of the surfactant used is preferably from 0.0001 to 2 mass %, more preferably from 0.0005 to 1 mass %, based on the entire amount of the negative chemical amplification resist composition (excluding the solvent).

[7] Other Additives

The negative chemical amplification resist composition of the present invention may further contain, if desired, a dye, a plasticizer, an acid-increasing agent (described, for example, in International Publication Nos. 95/29968 and 98/24000, JP-A-8-305262, JP-A-9-34106, JP-A-8-248561, JP-T-8-503082 (the term "JP-T" as used herein means a published Japanese translation of a PCT patent application), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943, JP-A-10-1508, JP-A-10-282642, JP-A-9-512498, JP-A-2000-62337, JP-A-2005-17730 and JP-A-2008-209889), and the like. As for all of these compounds, examples include those described for respective compounds in JP-A-2008-268935.

Organic Carboxylic Acid

The negative chemical amplification resist composition of the present invention preferably contains an organic carboxylic compound, in addition to the components described above. Examples of the organic carboxylic compound include an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, a phthalic acid, a terephthalic acid, an isophthalic acid, a 2-naphthoic acid, a 1-hydroxy-2-naphthoic acid, and a 2-hydroxy-3-naphthoic acid. At the time of performing electron beam exposure in vacuum, the organic carboxylic acid may vaporize from the resist film surface to contaminate the lithography chamber and therefore, the preferred compound is an aromatic organic carboxylic acid. Above all, for example, a benzoic acid, a 1-hydroxy-2-naphthoic acid and a 2-hydroxy-3-naphthoic acid are more preferred.

The amount of the organic carboxylic acid blended is preferably from 0.01 to 10 parts by mass, more preferably from 0.01 to 5 parts by mass, still more preferably from 0.01 to 3 parts by mass, per 100 parts by mass of the polymer compound (A).

[Onium Carboxylate]

The resist composition of the present invention may contain an onium carboxylate. Examples of the onium carboxylate include sulfonium carboxylate, iodonium carboxylate and ammonium carboxylate. In particular, the onium carboxylate is preferably iodonium carboxylate or sulfonium carboxylate. Furthermore, it is preferred that the carboxylate residue of the onium carboxylate does not contain an aromatic group and a carbon-carbon double bond. The anion moiety is preferably a linear or branched, monocyclic or polycyclic alkylcarboxylate anion having a carbon number of 1 to 30, more preferably the carboxylate anion above in which the alkyl group is partially or entirely fluorine-substituted. The alkyl chain may contain an oxygen atom. Thanks to such a configuration, the transparency to light at a wavelength of 220 nm or less is ensured, the sensitivity and resolution are enhanced, and the iso/dense bias and exposure margin are improved.

EXAMPLES

The present invention is described in greater detail below by referring to Examples, but the contents of the present invention are not limited thereto.

(I) Example as Negative Chemical Amplification Resist (Electron Beam)

1. Synthesis Example of Polymer Compound (A) (Component (A))

Synthesis Example 1

Synthesis of Polymer Compound (A1)

In 120 mL of tetrahydrofuran (THF), 20 g of poly(p-hydroxystyrene) (VP2500) produced by Nippon Soda Co., Ltd. was dissolved, and 4.96 g of 1-adamantanecarbonyl chloride and 3.37 g of triethylamine were added thereto. The mixture was stirred at 50° C. for 4 hours, and the reaction solution was returned to room temperature. Thereafter, 100 mL of ethyl acetate and 100 mL of distilled water were added thereto and while stirring the reaction solution in ice water, an aqueous 1 N HCl solution was added little by little to the reaction solution to effect neutralization. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and added dropwise to 2 L of hexane. After filtration, the powder was collected and vacuum-dried to obtain 20.6 g of Polymer Compound (A1).

Other polymer compounds were synthesized in the same manner as Polymer Compound (A1).

With respect to the polymer compounds obtained, the compositional ratio (molar ratio) of the polymer compound was calculated by $^1$H-NMR measurement. Also, the weight average molecular weight (Mw, in terms of polystyrene), number average molecular weight (Mn, in terms of polystyrene) and polydispersity (Mw/Mn, hereinafter sometimes referred to as "PDI") of the polymer compound were calculated by GPC (solvent: THF) measurement. In the Tables below, the weight average molecular weight and the polydispersity are shown together with the chemical formula and compositional ratio of the polymer compound.

TABLE 1

| Polymer Compound | Chemical Formula | Compositional Ratio (molar ratio) | Mass Average Molecular Weight (Mw) | Polydispersity |
|---|---|---|---|---|
| Polymer Compound (A1) | | 10/90 | 3500 | 1.1 |
| Polymer Compound (A2) | | 10/90 | 3400 | 1.1 |
| Polymer Compound (A3) | | 10/90 | 3500 | 1.1 |
| Polymer Compound (A4) | | 10/90 | 5000 | 1.1 |
| Polymer Compound (A5) | | 10/85/5 | 8000 | 1.4 |

TABLE 1-continued

| Polymer Compound | Chemical Formula | Compositional Ratio (molar ratio) | Mass Average Molecular Weight (Mw) | Polydispersity |
|---|---|---|---|---|
| Comparative Polymer Compound (N1) | 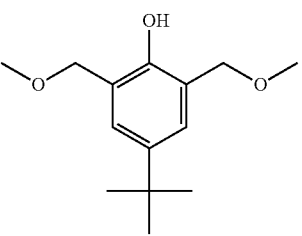 | 100 | 3200 | 1.1 |

2. Example

Example 1

(1) Preparation of Support

A Cr oxide-deposited 6-inch wafer (a wafer processed to form a shielding film used for a normal photomask) was prepared.

(2) Preparation of Resist Coating Solution (Coating Solution Formulation of Negative Chemical Amplification Resist Composition)

| | |
|---|---|
| Polymer Compound (A1) | 0.60 g |
| Photoacid Generator (z5) | 0.12 g |
| Crosslinking Agent CL-1 | 0.08 g |
| Crosslinking Agent CL-5 | 0.04 g |
| Tetra-(n-butyl)ammonium hydroxide (basic compound) | 0.002 g |
| 2-Hydroxy-3-naphthoic acid (organic carboxylic acid) | 0.012 g |
| Surfactant PF6320 (produced by OMNOVA) | 0.001 g |
| Propylene glycol monomethyl ether acetate (solvent) | 4.0 g |
| Propylene glycol monomethyl ether (solvent) | 5.0 g |

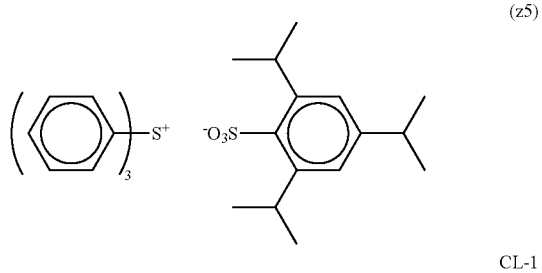

(z5)

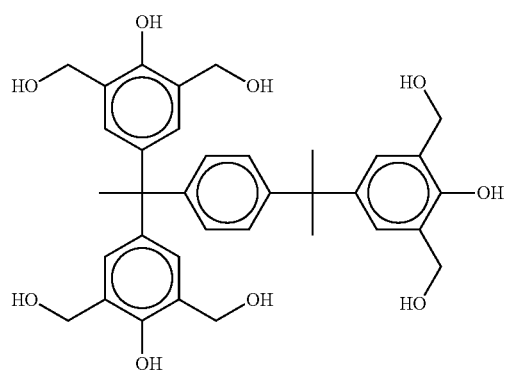

CL-1

-continued

CL-2

The solution of the composition above was microfiltered through a membrane filter having a pore size of 0.04 μm to obtain a resist coating solution.

(3) Preparation of Resist Film

The resist coating solution was applied on the 6-inch wafer by using Mark 8 manufactured by Tokyo Electron Ltd. and dried at 130° C. for 90 seconds on a hot plate to obtain a resist film having a thickness of 100 nm. That is, a resist-coated mask blanks was obtained.

(4) Production of Negative Resist Pattern (EB Exposure)

This resist film was patternwise irradiated by using an electron beam lithography device (HL750 manufactured by Hitachi, Ltd., accelerating voltage: 50 KeV). After the irradiation, the resist film was heated at 120° C. for 90 seconds on a hot plate, spray-developed for 30 seconds with a solvent obtained by mixing butyl acetate as the good solvent and decane as the poor solvent in a mass ratio of 85/15, and then thoroughly dried by spinning at 3,000 revolutions for 30 seconds by a spin coater.

(5) Evaluation of Resist Pattern

The obtained pattern was evaluated for the sensitivity, resolution, pattern profile, line edge roughness (LER) and dry etching resistance by the following methods.

The evaluation results are shown in Table 4.

[Sensitivity]

The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space=1:1) was taken as the sensitivity. A smaller value indicates higher sensitivity.

[Resolution (LS)]

The limiting resolution (the minimum line width when the line and the space were separated and resolved) at the exposure dose (dose of electron beam irradiation) giving the sensitivity above was taken as the LS resolution (nm).

[Pattern Profile]

The cross-sectional profile of the line pattern with a line width of 100 nm (L/S=1/1) at the exposure dose (dose of electron beam irradiation) giving the sensitivity above was observed by a scanning electron microscope (S-4300, manufactured by Hitachi, Ltd.). The cross-sectional profile of the line pattern was rated "reverse taper" when the ratio represented by [line width in the top part (surface part) of line pattern/line width in the middle of line pattern (the position of half the height of line pattern)] is 1.5 or more, rated "slightly reverse taper" when the ratio above is from 1.2 to less than 1.5, and rated "rectangle" when the ratio is less than 1.2.

[Line Edge Roughness (LER)]

A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of the measured distances was determined, and 3σ was computed. A smaller value indicates better performance.

[Dry Etching Resistance]

A resist film formed by performing entire surface irradiation with the irradiation dose (dose of electron beam irradiation) giving the sensitivity above was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Good: Residual film ratio of 95% or more.
Slightly bad: From 90% to less than 95%.
Bad: Less than 90%.

Example 2 to Example 9

Preparation of the resist solution, negative pattern formation and evaluation thereof were performed in the same manner as in Example 1 except that the components shown in Table 2 below and the baking conditions and development conditions shown in Table 3 below were used. The evaluation results are shown in Table 4. Incidentally, when the rinsing solution and rinsing time are indicated, the resist film after development was rinsed with the rinsing solution shown in Table 3 below for the time shown in Table 3 below and then thoroughly dried by spinning at 3,000 revolutions for 30 seconds by a spin coater.

The measurement of dissolution rate of the resist film by the good solvent or poor solvent used as the developer was performed as follows, and the results are shown in Table 3.

[Dissolution Rate]

A wafer having a resist film formed using the resist composition shown in Table 2 under the conditions shown in Table 3 was developed by spraying the good solvent or poor solvent used as the developer at a flow rate of 200 mL/min for 5 seconds while spinning the wafer at 1,000 rpm and then dried by high-speed spinning at 3,000 revolutions (rpm) for 20 seconds and further by heating for 60 seconds on a hot plate at 90° C., and thereafter, the film thickness was measured using VM8000-200 (manufactured by Dainippon Screen Mfg. Co., Ltd.).

The dissolution rate was calculated from the amount of change in the film thickness between before and after development. The measurement of film thickness was performed in a clean room at 23° C. and a relative humidity of 50%.

Dissolution rate=amount of change in film thickness between before and after development for 5 seconds/5 seconds Comparative Example 1 and Comparative Example 2

Preparation of the resist solution, negative pattern formation and evaluation thereof were performed in the same manner as in Example 1 except for using the components shown in Table 2 below in the resist solution formulation and using the baking conditions and development conditions shown in Table 3 below. The evaluation results are shown in Table 4. Incidentally, when the rinsing solution and rinsing time are indicated, the resist film after development was rinsed with the rinsing solution shown in Table 3 below for the time shown in Table 3 below and then thoroughly dried by spinning at 3,000 revolutions for 30 seconds by a spin coater.

TABLE 2

| | Resist Composition | | | | | | |
|---|---|---|---|---|---|---|---|
| | Polymer Compound (A) | Acid Generator (B) | Crosslinking Agent (C) | Basic Compound | Surfactant | Other Additives | Resist Solvent |
| Example 1 | A1 (0.6 g) | z5 (0.12 g) | CL-1/CL-5 (0.08 g/0.04 g) | D-1 (0.002 g) | W-1 (0.001 g) | F-2 (0.012 g) | S-1/S-2 (4.0 g/5.0 g) |
| Example 2 | A2 (0.6 g) | z37 (0.12 g) | CL-1 (0.1 g) | D-2 (0.0015 g) | W-1 (0.001 g) | F-2 (0.012 g) | S-1/S-2 (4.0 g/5.0 g) |
| Example 3 | A3 (0.6 g) | z10 (0.15 g) | CL-2 (0.08 g) | D-3 (0.0025 g) | W-1 (0.001 g) | F-2 (0.012 g) | S-1/S-2 (4.0 g/5.0 g) |
| Example 4 | A4 (0.6 g) | z44 (0.12 g) | CL-4 (0.08 g) | D-4 (0.002 g) | W-1 (0.001 g) | F-2 (0.012 g) | S-1/S-2 (4.0 g/5.0 g) |
| Example 5 | A5 (0.6 g) | z5/z48 (0.08 g/0.04 g) | CL-3 (0.06 g) | D-1 (0.002 g) | W-2 (0.001 g) | F-1 (0.012 g) | S-1/S-2/S-9 (4.0 g/4.0 g/1.0 g) |
| Example 6 | A1 (0.6 g) | z37 (0.12 g) | CL-1 (0.1 g) | D-1 (0.002 g) | W-1 (0.001 g) | — | S-1/S-2 (4.0 g/5.0 g) |
| Example 7 | A2 (0.6 g) | z37 (0.12 g) | CL-1 (0.1 g) | D-1 (0.002 g) | W-1 (0.001 g) | — | S-1/S-2 (4.0 g/5.0 g) |
| Example 8 | A1/A4 (0.2 g/0.4 g) | z37 (0.12 g) | CL-1 (0.1 g) | D-1/D-2 (0.001 g/0.001 g) | W-1 (0.001 g) | — | S-1/S-2 (4.0 g/5.0 g) |

TABLE 2-continued

| | Resist Composition | | | | | | |
|---|---|---|---|---|---|---|---|
| | Polymer Compound (A) | Acid Generator (B) | Crosslinking Agent (C) | Basic Compound | Surfactant | Other Additives | Resist Solvent |
| Example 9 | A5 (0.6 g) | z37 (0.12 g) | CL-1 (0.1 g) | D-1 (0.002 g) | W-1 (0.001 g) | — | S-1/S-2 (4.0 g/5.0 g) |
| Comparative Example 1 | N1 (0.6 g) | z5 (0.12 g) | CL-1 (0.1 g) | D-1 (0.002 g) | W-1 (0.001 g) | — | S-1/S-2 (4.0 g/5.0 g) |
| Comparative Example 2 | N1 (0.6 g) | z5 (0.12 g) | CL-1 (0.1 g) | D-1 (0.002 g) | W-1 (0.001 g) | — | S-1/S-2 (4.0 g/5.0 g) |

TABLE 3

| | Pattern Formation Conditions | | | | | | | | |
|---|---|---|---|---|---|---|---|---|---|
| | | | Development Conditions | | | | | | |
| | | | Developer (mass ratio) | | | | | | |
| | After Coating of Resist Baking Conditions | After Exposure Baking Conditions | Good Solvent | Dissolution Rate nm/sec | Poor Solvent | Dissolution Rate nm/sec | Boiling Point Difference Between Poor Solvent and Good Solvent (bp2 − bp1) | Development Time | Rinsing Solution | Rinsing Time |
| Example 1 | 130° C. (90 sec) | 120° C. (90 sec) | S-3 (85) | 100 | S-6 (15) | <0.01 | 48° C. | 30 sec | — | — |
| Example 2 | 130° C. (90 sec) | 110° C. (90 sec) | S-3 (100) | 80 | — | — | — | 30 sec | S-6 (100) | 30 sec |
| Example 3 | 130° C. (90 sec) | 120° C. (90 sec) | S-10 (100) | 35 | — | — | — | 30 sec | S-7 (100) | 30 sec |
| Example 4 | 130° C. (90 sec) | 110° C. (90 sec) | S-10 (85) | 30 | S-6 (15) | <0.01 | −11° C. | 30 sec | — | — |
| Example 5 | 130° C. (90 sec) | 120° C. (90 sec) | S-4 (85) | 25 | S-7 (15) | <0.01 | 54° C. | 30 sec | — | — |
| Example 6 | 130° C. (90 sec) | 110° C. (90 sec) | S-5 (85) | 150 | S-6 (15) | <0.01 | 22° C. | 30 sec | — | — |
| Example 7 | 150° C. (90 sec) | 110° C. (90 sec) | S-3 (85) | 70 | S-6 (15) | <0.01 | 48° C. | 30 sec | — | — |
| Example 8 | 130° C. (90 sec) | 110° C. (90 sec) | S-9 (85) | 60 | S-6 (15) | <0.01 | 19° C. | 30 sec | — | — |
| Example 9 | 130° C. (90 sec) | 110° C. (90 sec) | S-4 (100) | 80 | — | — | — | 30 sec | S-8 (100) | 30 sec |
| Comparative Example 1 | 130° C. (90 sec) | 120° C. (90 sec) | S-3 (100) | 50 | — | — | — | 30 sec | S-6 (100) | 30 sec |
| Comparative Example 2 | 130° C. (90 sec) | 120° C. (90 sec) | 2.38 mass % TMAH aqueous solution | | | | — | 30 sec | pure water | 30 sec |

The abbreviations in the Tables are those of specific examples or show the following compounds.

<Crosslinking Agent>

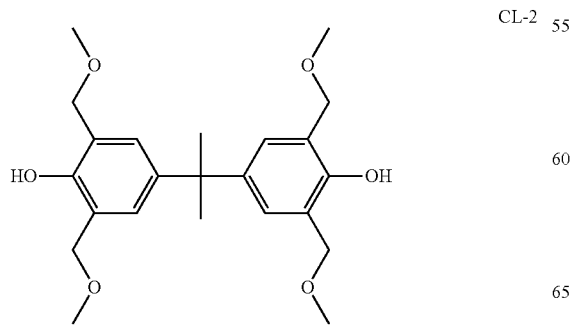

CL-2

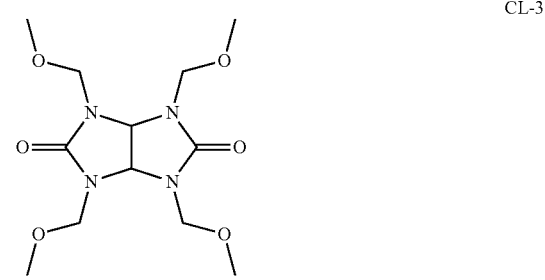

CL-3

-continued

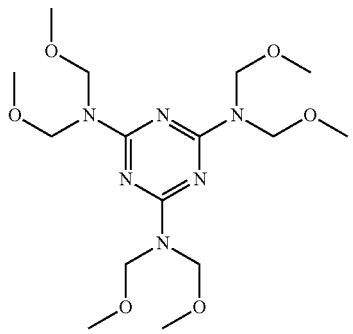

CL-4

<Basic Compound>
D-1: Tetra-(n-butyl)ammonium hydroxide
D-2: 1,8-Diazabicyclo[5.4.0]-7-undecene
D-3: 2,4,5-Triphenylimidazole
D-4: Tridecylamine
<Other Components>
F-1: Benzoic acid
F-2: 2-Hydroxy-3-naphthoic acid
<Resist Solvent, Developer and Rinsing Solution>
S-1: Propylene glycol monomethyl ether acetate (PGMEA), boiling point=146° C.
S-2: Propylene glycol monoethyl ether (PGME), boiling point=120° C.
S-3: Butyl acetate, boiling point=126° C.
S-4: Isoamyl acetate, boiling point=142° C.
S-5: Methyl amyl ketone, boiling point=152° C.
S-6: Decane, boiling point=174° C.
S-7: Undecane, boiling point=196° C.
S-8: 1-Hexanol, boiling point=157° C.
S-9: Ethyl lactate, boiling point=155° C.
S-10: Cycloheptanone, boiling point=185° C.
TMAH Aqueous Solution:
An aqueous tetramethylammonium hydroxide solution
<Surfactant>
W-1: PF6320 (produced by OMNOVA)
W-2: Megaface F176 (produced by Dainippon Ink & Chemicals, Inc.)

TABLE 4

| | Sensitivity ($\mu C/cm^2$) | LS Resolution (nm) | Pattern Profile | Line Edge Roughness (nm) | Dry Etching Resistance |
|---|---|---|---|---|---|
| Example 1 | 12 | 45 | rectangle | 4.0 | good |
| Example 2 | 11 | 45 | rectangle | 4.5 | good |
| Example 3 | 10 | 45 | rectangle | 4.0 | good |
| Example 4 | 12 | 60 | rectangle | 4.0 | good |
| Example 5 | 11 | 45 | rectangle | 5.0 | good |
| Example 6 | 11 | 55 | rectangle | 4.0 | good |
| Example 7 | 12 | 45 | rectangle | 4.5 | good |
| Example 8 | 12 | 50 | rectangle | 4.0 | good |
| Example 9 | 11 | 45 | rectangle | 5.0 | good |
| Comparative Example 1 | 12 | 70 | reverse taper | 6.0 | good |
| Comparative Example 2 | 10 | 80 | slightly reverse taper | 7.5 | good |

It is seen from the results shown in Table 4 that the composition according to the present invention can satisfy the high sensitivity, high resolution, good pattern profile, good line edge roughness (LER) and high dry etching resistance all at the same time.

(6) Reference Example 1 (EUV Exposure)

The resist composition described in Example 1 was microfiltered through a membrane filter having a pore size of 0.04 and the resulting resist coating solution was applied on a HMDS-treated 6-inch silicone wafer under the condition of 100° C. (60 seconds) by using Mark 8 manufactured by Tokyo Electron Ltd. and dried on a hot plate at 130° C. for 90 seconds to obtain a resist film having a thickness of 100 nm.

The obtained resist film was subjected to surface exposure by using EUV light (wavelength: 13 nm) while changing the exposure dose in steps of 0.5 mJ/cm$^2$ in the range of 0 to 10.0 mJ/cm$^2$ and after the irradiation, heated on a hot plate at 120° C. for 90 seconds.

Subsequently, the resist film was spray-developed for 30 seconds by using a butyl acetate/decane (85/15 by mass) mixed solvent and then thoroughly dried by spinning at 3,000 revolutions for 30 seconds by a spin coater.

The obtained wafer was measured for the film thickness corresponding to the exposure dose, and the exposure sensitivity and residual film ratio were measured by the following methods, as a result, the sensitivity was 4 mJ/cm$^2$ and the residual film ratio was 95%.

[EUV Sensitivity]
The exposure dose when the film thickness became 50% of the film thickness after coating of the resist coating solution was taken as the sensitivity.

[Residual Film Ratio]
The (film thickness after development/film thickness before exposure)×100 at the exposure dose three times the sensitivity obtained above was taken as the residual film ratio (%).

It is seen from Reference Example 1 that the composition according to the present invention has practically sufficient exposure sensitivity and residual film ratio also in the EUV exposure.

INDUSTRIAL APPLICABILITY

According to the present invention, a resist pattern forming method capable of forming a pattern satisfying high sensitivity, high resolution, good pattern profile, improved line edge roughness and good dry etching resistance all the same time, a resist pattern, a crosslinkable negative chemical amplification resist composition for organic solvent development, a resist film and a resist-coated mask blanks can be provided.

This application is based on Japanese patent application No. JP 2011-068467 filed on Mar. 25, 2011, the entire content of which is hereby incorporated by reference, the same as if set forth at length.

The invention claimed is:
1. A resist pattern forming method, comprising: in the following order,
(1) forming a resist film by using a negative chemical amplification resist composition containing (A) a polymer compound having a repeating unit represented by formula (1), (B) a compound capable of generating an acid upon irradiation with an actinic ray or radiation and

(C) a crosslinking agent capable of crosslinking the polymer compound (A) by an action of an acid;

(2) exposing the resist film, so as to form an exposed resist film; and (4) developing the exposed resist film by using a developer containing an organic solvent:

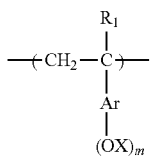

(1)

wherein $R_1$ represents a hydrogen atom or a methyl group;

X represents a group having a non-acid-decomposable polycyclic alicyclic hydrocarbon structure;

Ar represents an aromatic ring; and m is an integer of 1 or more.

2. The resist pattern forming method according to claim 1, wherein a concentration of the organic solvent in the developer is 50 mass % or more.

3. The resist pattern forming method according to claim 1, wherein the organic solvent contained in the developer is one or more kinds of solvents selected from the group consisting of an ester-based solvent, a ketone-based solvent, an alcohol-based solvent, an amide-based solvent, an ether-based solvent and a hydrocarbon-based solvent.

4. The resist pattern forming method according to claim 1, wherein the developer contains, as the organic solvent, a solvent (S-1) working out to a good solvent for the resist film before exposure and a solvent (S-2) working out to a poor solvent for the resist film before exposure, and assuming that a boiling point of the solvent (S-1) is (bp-1) and a boiling point of the solvent (S-2) is (bp-2), the solvents satisfy a relationship of formula (I):

$$(bp\text{-}2) > (bp\text{-}1) \qquad \text{formula (I).}$$

5. The resist pattern forming method according to claim 1, wherein the repeating unit represented by formula (1) is a repeating unit represented by the following formula (2) and the polymer compound (A) further contains a repeating unit represented by the following formula (3):

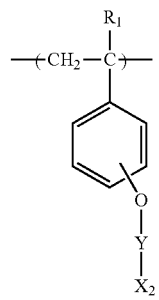

(2)

wherein $R_1$ represents a hydrogen atom or a methyl group;

Y represents a single bond or a divalent linking group; and $X_2$ represents a non-acid-decomposable polycyclic alicyclic hydrocarbon group:

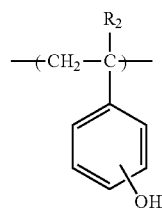

(3)

wherein $R_2$ represents a hydrogen atom or a methyl group.

6. The resist pattern forming method according to claim 4, wherein the solvent (S-1) is an ester-based solvent, a ketone-based solvent or an ether-based solvent.

7. The resist pattern forming method according to claim 4, wherein the solvent (S-2) is a hydrocarbon-based solvent.

8. The resist pattern forming method according to claim 7, wherein the exposure in (2) exposing the resist film is performed using an electron beam or EUV light.

9. A resist pattern, which is formed by the resist pattern forming method according to claim 1.

10. A crosslinkable negative chemical amplification resist composition for organic solvent development, which is used for the resist pattern forming method according to claim 1.

11. A resist film, which is formed from the crosslinkable negative chemical amplification resist composition according to claim 10.

12. A resist-coated mask blanks, which is coated with the resist film according to claim 11.

* * * * *